(12) United States Patent
Yamano

(10) Patent No.: US 8,564,116 B2
(45) Date of Patent: Oct. 22, 2013

(54) SEMICONDUCTOR DEVICE WITH REINFORCEMENT PLATE AND METHOD OF FORMING SAME

(75) Inventor: Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 237 days.

(21) Appl. No.: 12/793,732

(22) Filed: Jun. 4, 2010

(65) Prior Publication Data

US 2010/0320594 A1 Dec. 23, 2010

(30) Foreign Application Priority Data

Jun. 19, 2009 (JP) .................................. 2009-146016

(51) Int. Cl.
*H01L 23/48* (2006.01)
(52) U.S. Cl.
USPC ........... 257/698; 438/322; 438/637; 438/667; 438/122; 257/686; 257/707; 257/758
(58) Field of Classification Search
USPC ......... 438/122, 125, 126, 127, 622, 637, 667, 438/675; 257/698, 701, 706, 707, 758, 787, 257/796, 684, 720, 686
See application file for complete search history.

(56) References Cited

U.S. PATENT DOCUMENTS

| | | | |
|---|---|---|---|
| 6,020,629 A * | 2/2000 | Farnworth et al. | ............ 257/686 |
| 6,271,469 B1 | 8/2001 | Ma et al. | |
| 6,472,746 B2 | 10/2002 | Taniguchi et al. | |
| 8,101,868 B2 | 1/2012 | Ito et al. | |
| 2004/0201085 A1 * | 10/2004 | Ogawa et al. | .................. 257/678 |
| 2005/0258548 A1 * | 11/2005 | Ogawa et al. | .................. 257/778 |
| 2008/0211083 A1 * | 9/2008 | Kang et al. | ..................... 257/700 |
| 2009/0072384 A1 * | 3/2009 | Wong et al. | .................... 257/712 |

FOREIGN PATENT DOCUMENTS

| | | |
|---|---|---|
| JP | 2005-050737 | 2/2002 |
| JP | 2004-356649 | 12/2004 |
| WO | WO2007/043714 | 4/2007 |

OTHER PUBLICATIONS

Office Action dated Dec. 4, 2012 issued with respect to the basic Japanese Patent Application No. 2009-146016.

* cited by examiner

*Primary Examiner* — S. V. Clark
*Assistant Examiner* — Krista Soderholm
(74) *Attorney, Agent, or Firm* — IPUSA, PLLC

(57) ABSTRACT

A semiconductor device includes a reinforcement plate having an accommodating hole and a through hole extending from a first surface to a second surface, a semiconductor chip including a chip core and a pad formed on a pad surface of the chip core, the semiconductor chip disposed in the accommodating hole with the pad surface flush with the first surface, the chip core having substantially the same thickness as the reinforcement plate and including a semiconductor substrate, a through-hole electrode disposed in the through hole, resin sealing the semiconductor chip and the reinforcement plate, a interconnection pattern disposed on the first-surface side of the reinforcement plate to connect between the through-hole electrode and the pad, and a interconnection pattern disposed on the second-surface side of the reinforcement plate to be connected to the through-hole electrode, wherein the reinforcement plate is made of the same material as the semiconductor substrate.

3 Claims, 17 Drawing Sheets

SEMICONDUCTOR DEVICE WITH REINFORCEMENT PLATE AND METHOD OF FORMING SAME

BACKGROUND OF THE INVENTION

1. Field of the Invention

The disclosures herein generally relate to semiconductor devices and methods of manufacturing semiconductor devices, and particularly relate to a semiconductor device and a method of manufacturing a semiconductor device that includes a semiconductor chip, resin for sealing the semiconductor chip, and an interconnection pattern electrically connected to the semiconductor chip.

2. Description of the Related Art

A certain type of conventional semiconductor device includes resin for sealing a semiconductor chip and a multilayer interconnection structure that is formed on the semiconductor chip and the sealing resin to provide interconnection patterns electrically connected to the semiconductor chip. In this configuration, the interconnection patterns serve as external extensions of the interconnections of the semiconductor chip.

In the case of such a semiconductor device, the area size of the semiconductor device in its planar direction may correspond to its footprint on a mother board. Namely, its area size in the planar direction may correspond to the area size of the semiconductor device mounted on the mother board.

FIG. 1 is a cross-sectional view of a related-art semiconductor device.

A semiconductor device 200 illustrated in FIG. 1 includes a semiconductor chip 201, sealing resin 202, a multilayer interconnection structure 203, and external connection terminals 205.

The semiconductor chip 201 includes a semiconductor substrate 208, a semiconductor integrated circuit 209 formed on the semiconductor substrate 208, and electrode pads 211 disposed on and electrically connected to the semiconductor integrated circuit 209. The semiconductor chip 201 has an electrode pad forming surface 201A having the electrode pads 211 formed thereon, a back surface 201B situated opposite the electrode pad forming surface 201A, and side surfaces 201C. Silicon with a thermal expansion coefficient of 3.5 PPM, for example, may be used as the material of the semiconductor substrate 208.

The semiconductor chip 201 is sealed by the sealing resin 202 such that the electrode pad forming surface 201A and the electrode pads 211 are exposed.

The sealing resin 202 seals the back surface 201B and side surfaces 201C of the semiconductor chip 201. The sealing resin 202 has a multilayer interconnection structure forming surface 202A that is flush with the electrode pad forming surface 201A. Thermosetting epoxy resin, with a thermal expansion coefficient of 8 to 10 PPM, for example, may be used as the sealing resin 202.

The multilayer interconnection structure 203 includes a stacked layer structure 213, external connection pads 214, interconnection patterns 215, and a solder resist layer 217.

The stacked layer structure 213 is made by forming an insulating layer 221 and an insulating layer 222 one after another on the electrode pad forming surface 201A, the electrode pads 211, and the multilayer interconnection structure forming surface 202A.

The external connection pads 214 are disposed on a surface 222A of the insulating layer 222, which surface is situated opposite the surface of the insulating layer 222 that is in contact with the insulating layer 221.

The interconnection patterns 215 are embedded in the stacked layer structure 213. The interconnection patterns 215 are connected to the electrode pads 211 and to the external connection pads 214. With this arrangement, the semiconductor chip 201 is electrically connected to the external connection pads 214.

The solder resist layer 217 is formed on the surface 222A of the insulating layer 222. The solder resist layer 217 has openings 217A that expose the external connection pads 214 at the positions where the external connection terminals 205 are disposed.

The external connection terminals 205 are disposed on the external connection pads 214 exposed through the openings 217A. The external connection terminals 205 serve to electrically connect the semiconductor device 200 to a mounting board (not shown) such as a mother board. Solder balls may be used as the external connection terminals 205 (see U.S. Pat. No. 6,271,469, for example).

In the related-art semiconductor device 200, the sealing resin 202 having a thermal expansion coefficient (e.g., 8 to 10 PPM) different from the thermal expansion coefficient (e.g., 3.5 PPM) of the semiconductor substrate 208 is disposed to surround the side surfaces of the semiconductor substrate 208. With such a structure, the semiconductor device 200 may warp due to a difference in thermal expansion coefficients between the semiconductor substrate 208 and the sealing resin 202.

If the semiconductor device 200 warps, it is not possible to mount the semiconductor device 200 on a mounting board such as a mother board. In other words, the semiconductor device 200 cannot be electrically connected to the mounting board.

In the related-art semiconductor device 200, further, the multilayer interconnection structure 203 is disposed only on the multilayer interconnection structure forming surface 202A of the sealing resin 202. In other words, a multilayer interconnection structure is not formed on the surface 202B of the sealing resin 202 that is situated opposite the multilayer interconnection structure forming surface 202A. This is also a factor that contributes to the fact that the semiconductor device 200 is easy to warp. Further, this configuration may make it difficult to provide the semiconductor device 200 with a further multilayer interconnection structure.

Accordingly, it may be desirable to provide a semiconductor device and a method of manufacturing the semiconductor device that can avoid the warpage of the semiconductor device and that can increase the extent of multilayer interconnection structures.

SUMMARY OF THE INVENTION

It is a general object of the present invention to provide a semiconductor device and a method of forming a semiconductor device that substantially eliminate one or more problems caused by the limitations and disadvantages of the related art.

According to an embodiment, a semiconductor device includes a reinforcement plate having a first surface, a second surface situated opposite the first surface, an accommodating hole, and a through hole, each of the accommodating hole and the through hole extending from the first surface to the second surface; a semiconductor chip disposed in the accommodating hole, the semiconductor chip including a chip core and an electrode pad formed on an electrode pad forming surface of the chip core, the chip core having substantially the same thickness as the reinforcement plate and including a semiconductor substrate, the semiconductor chip having the electrode pad forming surface flush with the first surface; a through-hole electrode disposed in the through hole; an insulating film disposed between the through-hole electrode and a sidewall of the through hole; a resin member sealing the semiconductor chip and the reinforcement plate; a first interconnection pattern disposed on the same side of the reinforcement plate as the first surface to connect between the through-hole electrode and the electrode pad, at least part of the first interconnection pattern being situated in the resin member; and a second interconnection pattern disposed on the same side of the reinforcement plate as the second surface to be connected to the through-hole electrode, at least part of the second interconnection pattern being situated in the resin member, wherein a material of the reinforcement plate is the same as a material of the semiconductor substrate.

According to an embodiment, a method of forming a semiconductor device including a semiconductor chip is provided. The semiconductor chip includes a chip core and an electrode pad formed on an electrode pad forming surface of the chip core. The method includes forming an accommodating hole and a through hole through a substrate member to extend from an upper surface of the substrate member to a lower surface of the substrate member, the substrate member being made of the same material as a semiconductor substrate of the chip core and having substantially the same thickness as the chip core; forming an insulating film on a sidewall of the through hole; forming a through-hole electrode in the through hole having the insulating film formed thereon; attaching a first insulating resin layer in a semi-cured state to the lower surface of the substrate member to seal the substrate member and a lower end of the accommodating hole; placing a semiconductor chip in the accommodating hole such that a back surface of the chip core is in contact with the first insulating resin layer; attaching a second insulating resin layer in a semi-cured state to the upper surface of the substrate member to seal the substrate member and the chip core; applying heat to cause the first and second insulating resin layers to fully cure; and forming a first interconnection pattern on the same side of the reinforcement plate as the upper surface to connect between the through-hole electrode and the electrode pad, at least part of the first interconnection pattern being situated in the second insulating resin layer, and forming a second interconnection pattern on the same side of the reinforcement plate as the lower surface to be connected to the through-hole electrode, at least part of the second interconnection pattern being situated in the first insulating resin layer.

According to at least one embodiment, the warpage of the semiconductor device is reduced, and the extent of multilayer interconnection structures is further increased.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments will be described with reference to the accompanying drawings.

Figure 1:
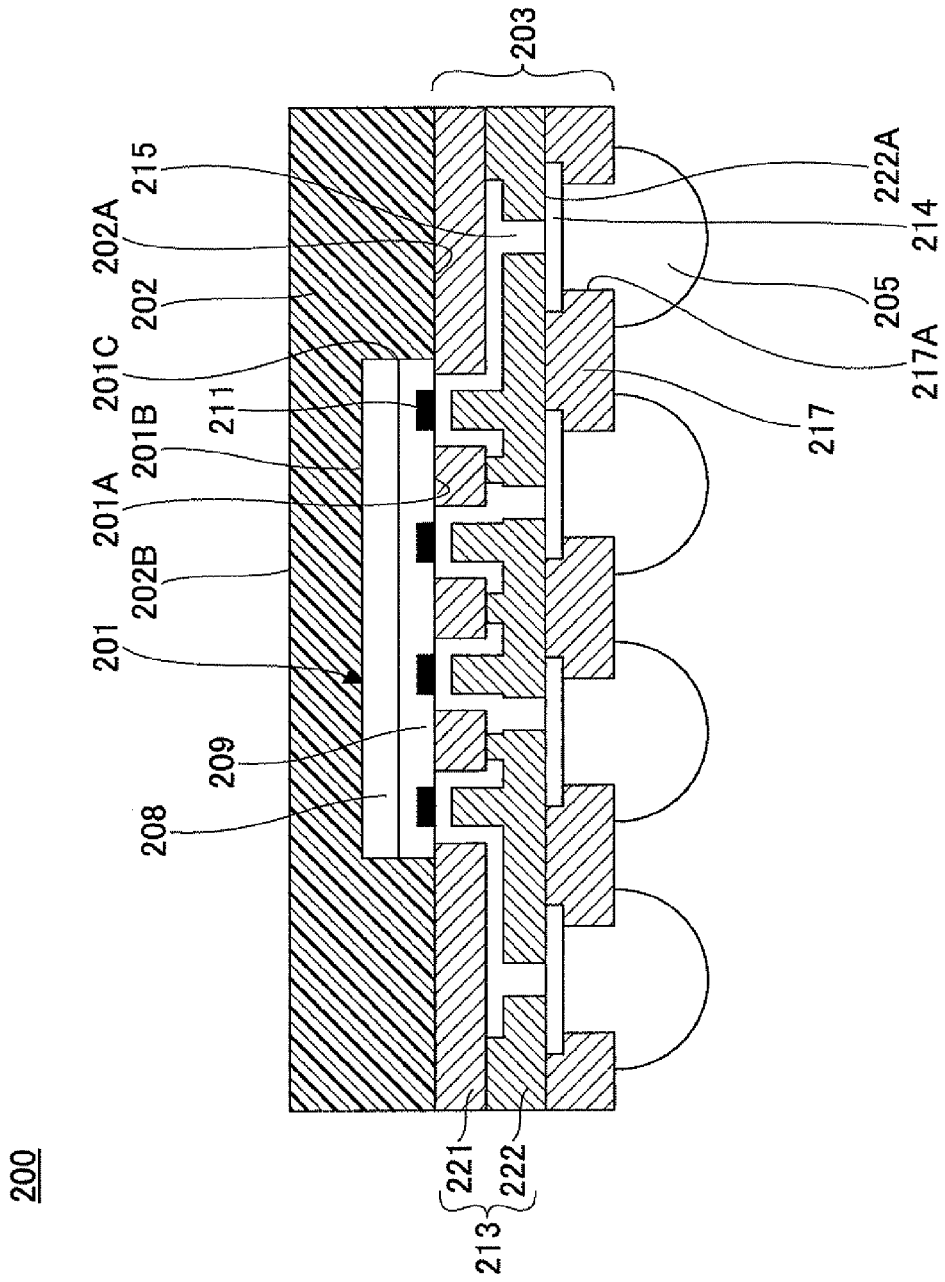
FIG. 1 is a cross-sectional view of a related-art semiconductor device.
Figure 2:
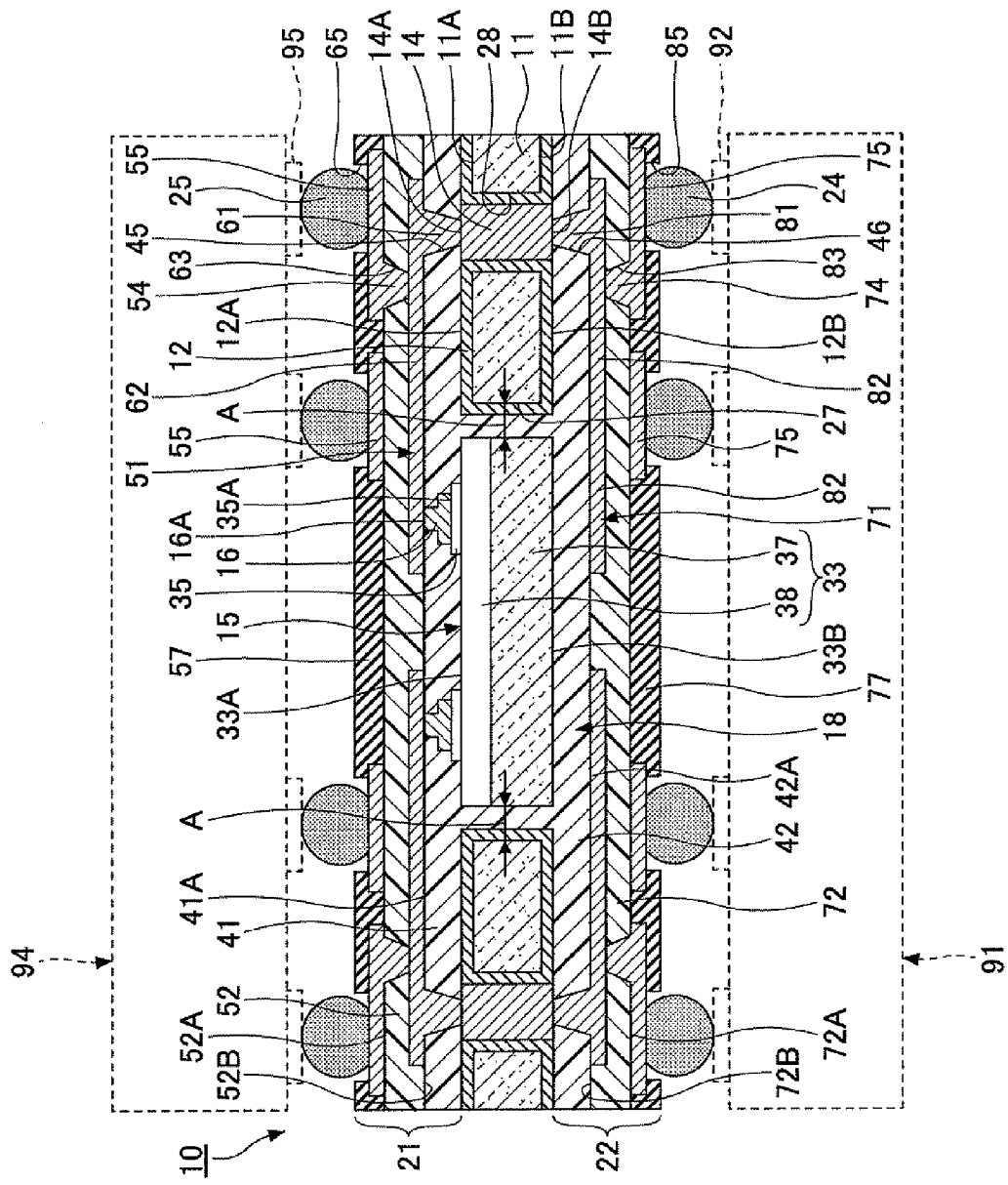
FIG. 2 is a cross-sectional view of a semiconductor device according to an embodiment.

FIG. 2 is a cross-sectional view of a semiconductor device according to an embodiment.

A semiconductor device 10 illustrated in FIG. 2 according to the present embodiment includes a reinforcement plate 11, an insulating film 12, through-hole electrodes 14, a semiconductor chip 15, internal connection terminals 16, a resin member 18, a first multilayer interconnection structure 21, a second multilayer interconnection structure 22, and external connection terminals 24 and 25.

The reinforcement plate 11 has a plate shape, and has through holes 27 and 28. The accommodating hole 27 is formed to penetrate through the reinforcement plate 11 at the center. The accommodating hole 27 provides space for accommodating the semiconductor chip 15. The accommodating hole 27 has such size that the semiconductor chip 15 can be accommodated. A gap A between the sidewall of the accommodating hole 27 and the side surfaces of the semiconductor chip 15 accommodated in the accommodating hole 27 may be 50 to 100 micrometers.

A plurality of through holes 28 are formed to penetrate through the reinforcement plate 11 at positions around the accommodating hole 27. The diameter of the through holes 28 may range from 60 micrometers to 300 micrometers.

A surface 11A of the reinforcement plate 11 (which may also be referred to as a "first surface") and a surface 11B of the reinforcement plate 11 situated opposite the surface 11A of the reinforcement plate 11 are flat. The surface 11A of the reinforcement plate 11 is situated on the same side of the reinforcement plate 11 as the upper end (i.e., one end) of the through holes 28. The surface 11A of the reinforcement plate 11 is substantially flush with an electrode pad forming surface 33A of a chip core 33, which is part of the semiconductor chip 15 as will be described later. Further, the surface 11B of the reinforcement plate 11 is substantially flush with a back surface 33B of the chip core 33.

Namely, the thickness of the reinforcement plate 11 is substantially equal to the thickness of the chip core 33. In the case of the thickness of the chip core 33 being 100 micrometers, the thickness of the reinforcement plate 11 may be 100 micrometers, for example.

The material of the reinforcement plate 11 having the above-described configuration is the same as the material of a semiconductor substrate 37, which is part of the semiconductor chip 15. In the case of the material of the semiconductor substrate being silicon with a thermal expansion coefficient of 3.5 PPM, for example, the material of the reinforcement plate 11 may also be silicon with a thermal expansion coefficient of 3.5 PPM, for example.

As described above, the reinforcement plate 11 having the accommodating hole 27 for accommodating the semiconductor chip 15 is provided, and the thickness of the reinforcement plate 11 and the thickness of the chip core 33 (which is part of the semiconductor chip 15) are made substantially equal to each other. Further, the material of the reinforcement plate 11 is selected as the same material as that of the semiconductor substrate 37 (which is part of the chip core 33), so that the reinforcement plate 11 having the same thermal expansion coefficient as the semiconductor substrate 37 is situated around the side surfaces of the semiconductor chip 15. With this arrangement, a difference in thermal expansion coefficients between the semiconductor chip 15 and the reinforcement plate 11 situated around the semiconductor chip 15 is made small. This serves to reduce the warpage of the semiconductor device 10 caused by a mismatch in thermal expansion coefficients between the semiconductor chip 15 and the reinforcement plate 11.

The insulating film 12 is disposed to cover the surfaces 11A and 11B of the reinforcement plate 11, the sidewalls of the accommodating hole 27, and the sidewalls of the through holes 28. Here, the sidewalls of the accommodating hole 27 and the sidewalls of the through holes 28 refer to the side faces of the reinforcement plate 11 inside the accommodating hole 27 and through holes 28. The insulating film 12 formed on the sidewalls of the through holes 28 serve to provide electrical insulation between the reinforcement plate 11 and the through-hole electrodes 14 formed in the through holes 28. A SiO$_2$ film (with a thickness of 1.0 micrometer, for example) may be used as the insulating film 12, for example.

In FIG. 2, the insulating film 12 is illustrated to be thicker than it may be for the purpose of making it easier to visually identify the insulating film 12. In reality, the thickness of the insulating film 12 (e.g., 1 micrometer) is substantially thin compared to the thickness of the reinforcement plate 11 (e.g., 100 micrometers).

The insulating film 12 may be provided at least on the sidewalls of the through holes 28. In other words, the insulating film 12 may be provided or may not be provided on the surfaces 11A and 11B of the reinforcement plate 11 and the sidewalls of the accommodating hole 27.

The through-hole electrodes 14 are situated in through holes 28 that have the insulating film 12 formed therein. End faces 14A of the through-hole electrodes 14 (i.e., a face on one end of a through-hole electrode 14) are flat. The end faces 14A of the through-hole electrodes 14 are configured to be substantially flush with the top surface 12A of the insulating film 12 formed on the surface 11A of the reinforcement plate 11.

End faces 14B of the through-hole electrodes 14 (i.e., a face on the opposite end of a through-hole electrode 14) are flat. The end faces 14B of the through-hole electrodes 14 are configured to be substantially flush with the bottom surface 12B of the insulating film 12 formed on the surface 11B of the reinforcement plate 11. Cu may be used as the material of the through-hole electrodes 14.

The through-hole electrodes 14 having the above-described configuration serve to provide electrical connections between interconnection patterns 51 formed on the surface 11A of the reinforcement plate 11 and interconnection patterns formed on the surface 11B of the reinforcement plate 11.

With the provision of the through-hole electrodes 14 penetrating through the reinforcement plate 11, electrical connections are established through the through-hole electrodes 14 between the interconnection patterns 51 formed on the same side of the reinforcement plate 11 as the surface 11A and the interconnection patterns 71 formed on the same side of the reinforcement plate 11 as the surface 11B. This makes it possible to form multilayer interconnection structures (i.e., the first and second multilayer interconnection structures 21 and 22 in the present embodiment) on both of the surfaces 11A and 11B of the reinforcement plate 11, thereby increasing the extent of multilayer interconnection structures of the semiconductor device 10.

The semiconductor chip 15 includes a chip core 33 and electrode pads 35. The chip core 33 includes a semiconductor substrate 37, a semiconductor integrated circuit 38, an electrode pad forming surface 33A, and a back surface 33B.

The semiconductor substrate 37 serves as a substrate on which the semiconductor integrated circuit 38 is formed. Silicon with a thermal expansion coefficient of 3.5 PPM, for example, may be used as the material of the semiconductor substrate 37.

The semiconductor integrated circuit 38 is formed in and on a surface of the semiconductor substrate 37. The semiconductor integrated circuit 38 includes diffusion layers (not shown), a plurality of insulating layers stacked one over another (not shown), and interconnection lines and vias (not shown) formed in the plurality of insulating layers.

The electrode pad forming surface 33A corresponds to the upper surface of the semiconductor integrated circuit 38. The electrode pad forming surface 33A is formed as a flat surface.

The back surface 33B of the chip core 33 corresponds to the back surface of the semiconductor substrate 37. The back surface 33B of the chip core 33 is formed as a flat surface.

The thickness of the chip core 33 is configured to be substantially equal to the thickness of the reinforcement plate 11. In the case of the thickness of the reinforcement plate 11 being 100 micrometers, the thickness of the chip core 33 may be 100 micrometers, for example.

The electrode pads 35 are formed on the electrode pad forming surface 33A of the chip core 33. The electrode pads 35 have connection surfaces 35A on which the internal connection terminals 16 are disposed. The electrode pads 35 are electrically connected to the semiconductor integrated circuit 38. Al may be used as the material of the electrode pads 35.

The semiconductor chip 15 having the above-described configuration is accommodated in the accommodating hole 27, such that the electrode pad forming surface 33A is positioned to be substantially flush with the surface 11A of the reinforcement plate 11, and such that the back surface 33B of the chip core 33 is positioned to be substantially flush with the surface 11B of the reinforcement plate 11. The semiconductor chip 15 accommodated in the accommodating hole 27 is sealed by the resin member 18. A semiconductor chip for use as a logic device such as a CPU or MPU may be used as the semiconductor chip 15.

The internal connection terminals 16 are disposed on the connection surfaces 35A of the electrode pads 35. With this arrangement, the internal connection terminals 16 are electrically connected to the semiconductor chip 15. The internal connection terminals 16 have end faces 16A that are situated on the opposite side to the connection surfaces 35A of the electrode pads 35 and that are exposed through the resin member 18. The end faces 16A of the internal connection terminals 16 are made as flat surfaces. The end faces 16A of the internal connection terminals 16 are connected to the interconnection patterns 51. Bumps (e.g., Au bumps) may be used as the internal connection terminals 16.

The resin member 18 is disposed on and beneath the semiconductor chip 15, in gaps between the side faces of the semiconductor chip 15 accommodated in the accommodating hole 27 and the sidewalls of the accommodating hole 27, on the upper surface 12A of the insulating film 12 situated on the surface 11A of the reinforcement plate 11, and on the lower surface 12B of the insulating film 12 situated on the surface 11B of the reinforcement plate 11.

The resin member 18 seals the semiconductor chip 15, and also fills the gaps between the reinforcement plate 11 having the insulating film 12 formed thereon and the side faces of the semiconductor chip 15 accommodated in the accommodating hole 27.

For the sake of convenience of explanation, the portion of the resin member 18 that is situated above the upper surface 12A of the insulating film 12 in FIG. 2 (i.e., on the same side of the reinforcement plate 11 as the surface 11A) will be referred to as a first resin member 41, and the portion of the resin member 18 that is situated below the lower surface 12B of the insulating film 12 in FIG. 2 (i.e., on the same side of the reinforcement plate 11 as the surface 11B) will be referred to as a second resin member 42. A further description will be provided by using these reference terms.

The first resin member 41 is provided on the upper surface 12A of the insulating film 12, the end faces 14A of the through-hole electrodes 14, and on the electrode pad forming surface 33A to seal the electrode pads 35 and the side faces of the internal connection terminals 16. The first resin member 41 has a flat surface 41A (i.e., the upper surface of the resin member 18) that exposes the end faces 16A of the internal connection terminals 16. The surface 41A of the first resin member 41 is formed to be flush with the end faces 16A of the internal connection terminals 16. The first resin member 41 has openings 45 that expose the end faces 14A of the through-hole electrodes 14. The thickness of the first resin member 41 may be 30 micrometers, for example.

The second resin member 42 is provided on the lower surface 12B of the insulating film 12, the end faces 14B of the through-hole electrodes 14, and the back surface 33B of the chip core 33. The second resin member 42 has a flat surface 42A (i.e., the lower surface of the resin member 18) on the opposite side to the surface that is in contact with the back surface 33B of the chip core 33. The second resin member 42 has openings 46 that expose the end faces 14B of the through-hole electrodes 14. The thickness of the second resin member 42 may be 30 micrometers, for example.

Thermosetting epoxy resin may be used as the material of the resin member 18 having the configuration described above.

The first multilayer interconnection structure 21 includes the first resin member 41, the interconnection patterns 51 also referred to as first interconnection patterns, an insulating layer 52 also referred to as a first insulating layer, vias 54 also referred to as first vias, external connection pads 55 also referred to as first external connection pads, and a solder resist layer 57.

The interconnection patterns 51 include vias 61 and interconnection lines 62. The vias 61 are formed in the openings 45. The vias 61 are connected to the end faces 14A of the through-hole electrodes 14. With this arrangement, the interconnection patterns 51 are electrically connected to the through-hole electrodes 14.

The interconnection lines 62 are formed as an integral, unitary structure with the vias 61. The interconnection lines 62 are situated on the surface 41A of the first resin member 41 and the end faces 16A of the internal connection terminals 16. With this arrangement, the interconnection lines 62 are electrically connected to the end faces 16A of the internal connection terminals 16.

The interconnection patterns 51 having the above-described configuration electrically connect between the through-hole electrodes 14 and the semiconductor chip 15. Cu may be used as the material of the interconnection patterns 51.

The insulating layer 52 is stacked on the surface 41A of the first resin member 41 to cover the interconnection lines 62, except for the positions at which the vias 54 are connected. The insulating layer 52 has openings 63. The openings 63 are formed to expose the interconnection lines 62. The openings 63 are formed to penetrate through the insulating layer 52 at the positions between the interconnection lines 62 and the external connection pads 55. Thermosetting epoxy resin may be used as the material of the insulating layer 52.

The vias 54 are formed in the openings 63. The vias 54 are connected to the interconnection lines 62 and to the external connection pads 55. Cu may be used as the material of the via 54.

The external connection pads 55 are disposed on a surface 52A of the insulating layer 52, which surface is situated opposite the surface 52B of the insulating layer 52 that is in contact with the resin member 18. The external connection pads 55 are formed as an integral, unitary structure with the vias 54. With this arrangement, the external connection pads 55 are electrically connected to the through-hole electrodes 14 and the semiconductor chip 15 through the interconnection patterns 51 and the vias 54. Cu may be used as the material of the external connection pads 55.

The solder resist layer 57 is formed on the surface 52A of the insulating layer 52. The solder resist layer 57 has openings 65 that expose the external connection pads 55.

The second multilayer interconnection structure 22 includes the second resin member 42, the interconnection patterns 71 also referred to as second interconnection patterns, an insulating layer 72 also referred to as a second insulating layer, vias 74 also referred to as second vias, external connection pads 75 also referred to as second external connection pads, and a solder resist layer 77.

The interconnection patterns 71 include vias 81 and interconnection lines 82. The vias 81 are formed in the openings 46. The vias 81 are connected to the end faces 14B of the through-hole electrodes 14. With this arrangement, the interconnection patterns 71 are electrically connected to the interconnection patterns 51 through the through-hole electrodes 14.

The interconnection lines 82 are formed as an integral, unitary structure with the vias 81. The interconnection lines 82 are disposed on the surface 42A of the second resin member 42. Cu may be used as the material of the interconnection patterns 71.

The insulating layer 72 is stacked on the surface 42A of the second resin member 42 to cover the interconnection lines 82, except for the positions at which the vias 74 are connected. The insulating layer 72 has openings 83. The openings 83 are formed to expose the interconnection lines 82. The openings 83 are formed to penetrate through the insulating layer 72 at the positions between the interconnection lines 82 and the external connection pads 75. Thermosetting epoxy resin may be used as the material of the insulating layer 72.

The vias 74 are formed in the openings 83. The vias 74 are connected to the interconnection lines 82 and to the external connection pads 75. Cu may be used as the material of the via 74.

The external connection pads 75 are disposed on a surface 72A of the insulating layer 72, which surface is situated opposite the surface 72B of the insulating layer 72 that is in contact with the second resin member 42. The external connection pads 75 are formed as an integral, unitary structure with the vias 74. With this arrangement, the external connection pads 75 are electrically connected to the through-hole electrodes 14 and the semiconductor chip 15 through the interconnection patterns 71 and the vias 74. Cu may be used as the material of the external connection pads 75.

The solder resist layer 77 is formed on the surface 72A of the insulating layer 72. The solder resist layer 77 has openings 85 that expose the external connection pads 75.

The stacked-layer structure of the second multilayer interconnection structure 22 described above has substantially the same stacked-layer structure as (i.e., similar structure to) the first multilayer interconnection structure 21.

As described above, the first multilayer interconnection structure 21 is disposed on the surface 11A of the reinforcement plate 11, and the second multilayer interconnection structure 22 having a similar structure to the first multilayer interconnection structure 21 is disposed on the surface 11B of the reinforcement plate 11. This makes it possible to reduce the warpage of the semiconductor device 10.

The external connection terminals 24 are disposed on the external connection pads 75 exposed through the openings 85. The external connection terminals 24 are to be connected to pads 92 of a mounting board 91 such as a mother board. Solder balls may be used as the external connection terminals 24.

The external connection terminals 25 are disposed on the external connection pads 55 exposed through the openings 65. With this arrangement, the external connection terminals 25 are electrically connected to the external connection terminals 24 through the through-hole electrodes 14. The external connection terminals 25 are to be connected to pads 95 of another semiconductor device 94, for example. Solder balls may be used as the external connection terminals 25.

As described above, the external connection terminals 24 are provided on the lower surface of the semiconductor device 10 for connection with the mounting board 91. Further, the external connection terminals 25 that are electrically connected to the external connection terminals 24 through the through-hole electrodes 14 are provided on the upper surface of the semiconductor device 10. With this arrangement, another semiconductor device 94 electrically connected to the semiconductor device 10 may be disposed on the semiconductor device 10, thereby achieving a higher mounting density.

According to the semiconductor device of the present embodiment, the reinforcement plate 11 having the accommodating hole 27 for accommodating the semiconductor chip 15 is provided, and the thickness of the reinforcement plate 11 and the thickness of the chip core 33 (which is part of the semiconductor chip 15) are made substantially equal to each other. Further, the material of the reinforcement plate 11 is selected as the same material as that of the semiconductor substrate 37 (which is part of the chip core 33), so that the reinforcement plate 11 having the same thermal expansion coefficient as the semiconductor substrate is situated around the side surfaces of the semiconductor chip 15. With this arrangement, a difference in thermal expansion coefficients between the semiconductor chip 15 and the reinforcement plate 11 situated around the semiconductor chip 15 is made small. This serves to reduce the warpage of the semiconductor device 10 caused by a mismatch in thermal expansion coefficients between the semiconductor chip 15 and the reinforcement plate 11.

Further, with the provision of the through-hole electrodes 14 penetrating through the reinforcement plate 11, electrical connections are established through the through-hole electrodes 14 between the interconnection patterns 51 formed on the same side of the reinforcement plate 11 as the surface 11A and the interconnection patterns 71 formed on the same side of the reinforcement plate 11 as the surface 11B. This makes it possible to form multilayer interconnection structures (i.e., the first and second multilayer interconnection structures 21 and 22 in the present embodiment) on both of the surfaces 11A and 11B of the reinforcement plate 11, thereby increasing the extent of multilayer interconnection structures of the semiconductor device 10.

Moreover, the structures of the first and second multilayer interconnection structures 21 and 22 are made substantially equivalent to each other, so that the warpage of the semiconductor device 10 can be reduced even when the first and second multilayer interconnection structures 21 and 22 are provided.

FIGS. 3 through 17 are drawings illustrating the steps of manufacturing the semiconductor device according to the present embodiment. In FIG. 3 through FIG. 17, the same elements as those of the semiconductor device 10 of the present embodiment are referred to by the same numerals. Further, the reference symbol "C" illustrated in FIG. 3 through FIG. 17 refers to the positions at which a substrate member 101 is cut in the process step illustrated in FIG. 17. These positions will be hereinafter referred to as "cut positions C".

In the following, the steps of manufacturing the semiconductor device 10 according to the present embodiment will be described by referring to FIG. 3 through FIG. 17.

Figure 3:
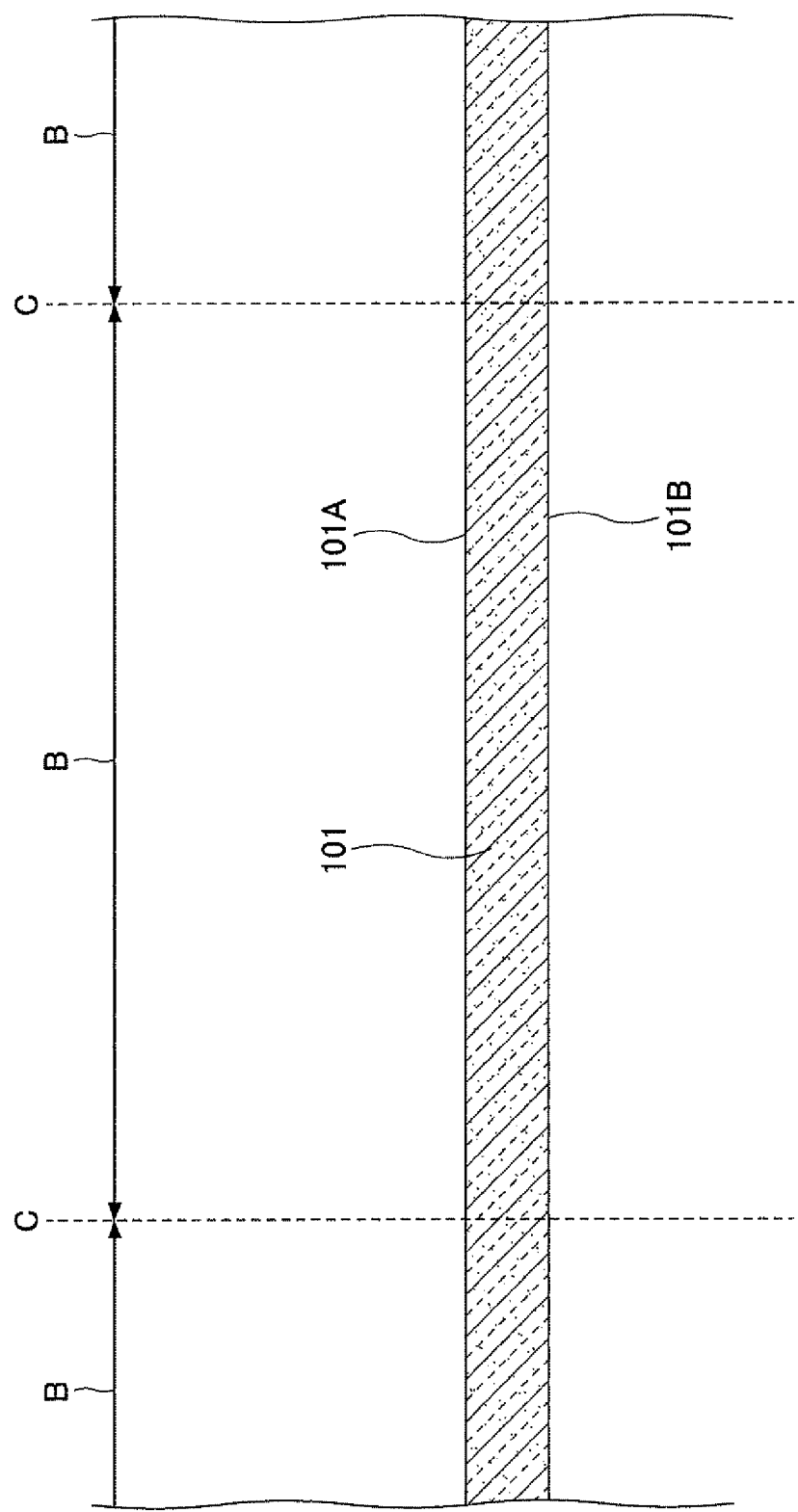
FIG. 3 is a drawing (part 1) illustrating a process step of manufacturing the semiconductor device according to the embodiment.

In the process step (i.e., substrate member preparation step) illustrated in FIG. 3, a substrate member 101 that has a plurality of semiconductor device forming areas B to serve as a basis for a plurality of reinforcement plates 11 is provided.

The substrate member 101 is made of the same material as the semiconductor substrate 37. In the case of the material of the semiconductor substrate 37 being silicon, the material of the substrate member 101 is also silicon. The substrate member 101 has substantially the same thickness as the chip core 33. In the case of the thickness of the chip core 33 being 100 micrometers, the thickness of the substrate member 101 may be 100 micrometers, for example.

Figure 4:
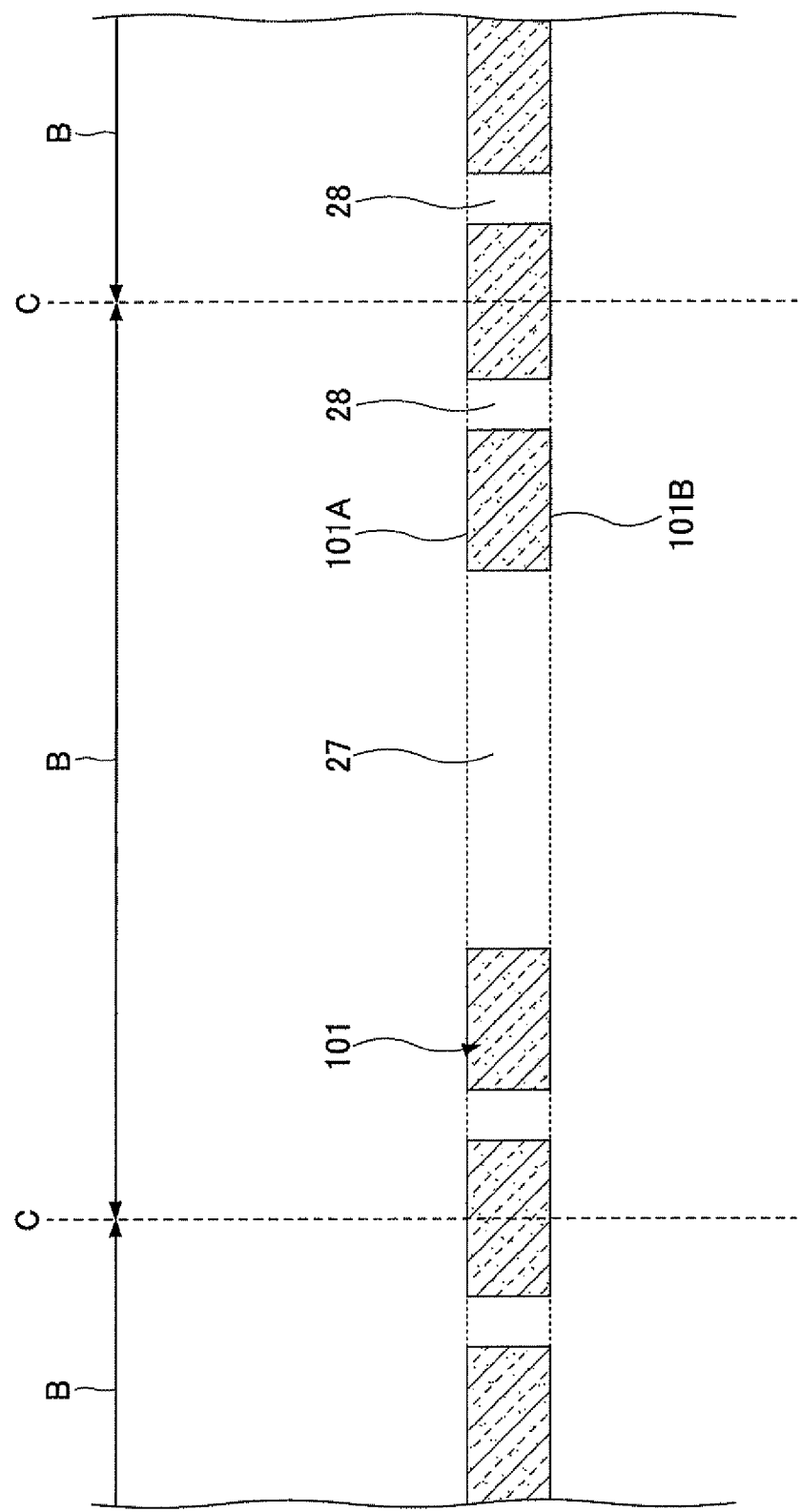
FIG. 4 is a drawing (part 2) illustrating a process step of manufacturing the semiconductor device according to the embodiment.

In the process step (i.e., through-hole forming step) illustrated in FIG. 4, the accommodating hole 27 and the through holes 28 are simultaneously formed through the substrate member 101 illustrated in FIG. 3.

Specifically, an etching mask (not shown) having openings to expose an upper surface 101A of the substrate member 101 at the positions where the accommodating hole 27 and the through holes 28 are to be formed is formed on the upper surface 101A of the substrate member 101 illustrated in FIG. 3, for example. Anisotropic etching (e.g., dry etching) is then performed by use of this etching mask to form the accommodating hole 27 and the through holes 28 that penetrate through the substrate member 101.

Figure 5:
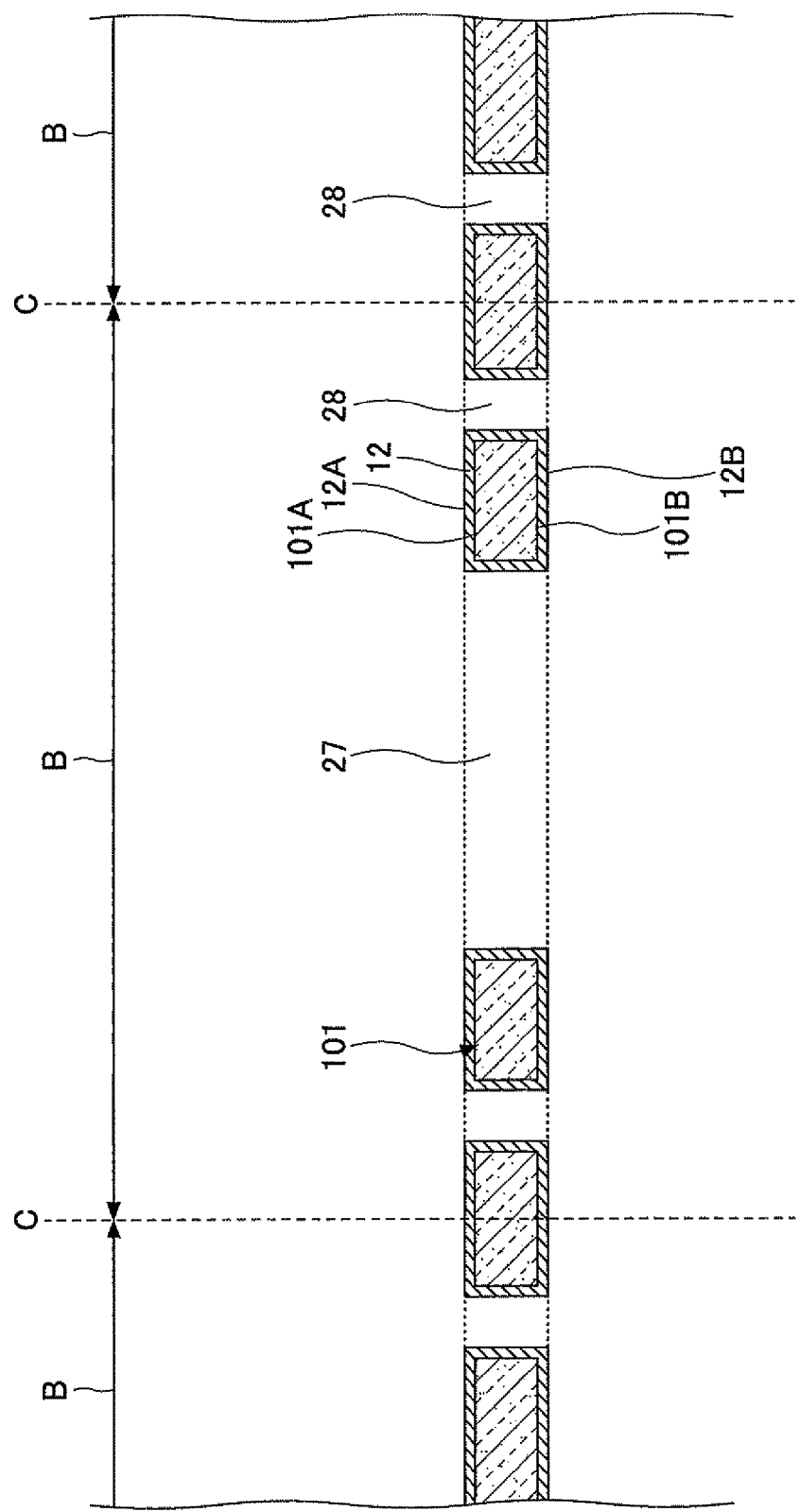
FIG. 5 is a drawing (part 3) illustrating a process step of manufacturing the semiconductor device according to the embodiment.

In the process step (i.e., insulating-film forming step) illustrated in FIG. 5, the insulating film 12 is formed on the surfaces 101A and 101B, the sidewalls of the accommodating hole 27, and the sidewalls of the through holes 28. Namely, the insulating film 12 is formed on all the surfaces of the substrate member 101 that has the accommodating hole 27 and the through holes 28.

Specifically, the insulating film 12 may be formed by use of the thermal oxidation method or the CVD (chemical vapor deposition) method, for example. An oxide film (e.g., $SiO_2$ film), for example, may be used as the insulating layer 12. In the case of a $SiO_2$ film being used as the insulating film 12, the thickness of the insulating film 12 may be set to 1.0 micrometer, for example.

Figure 6:
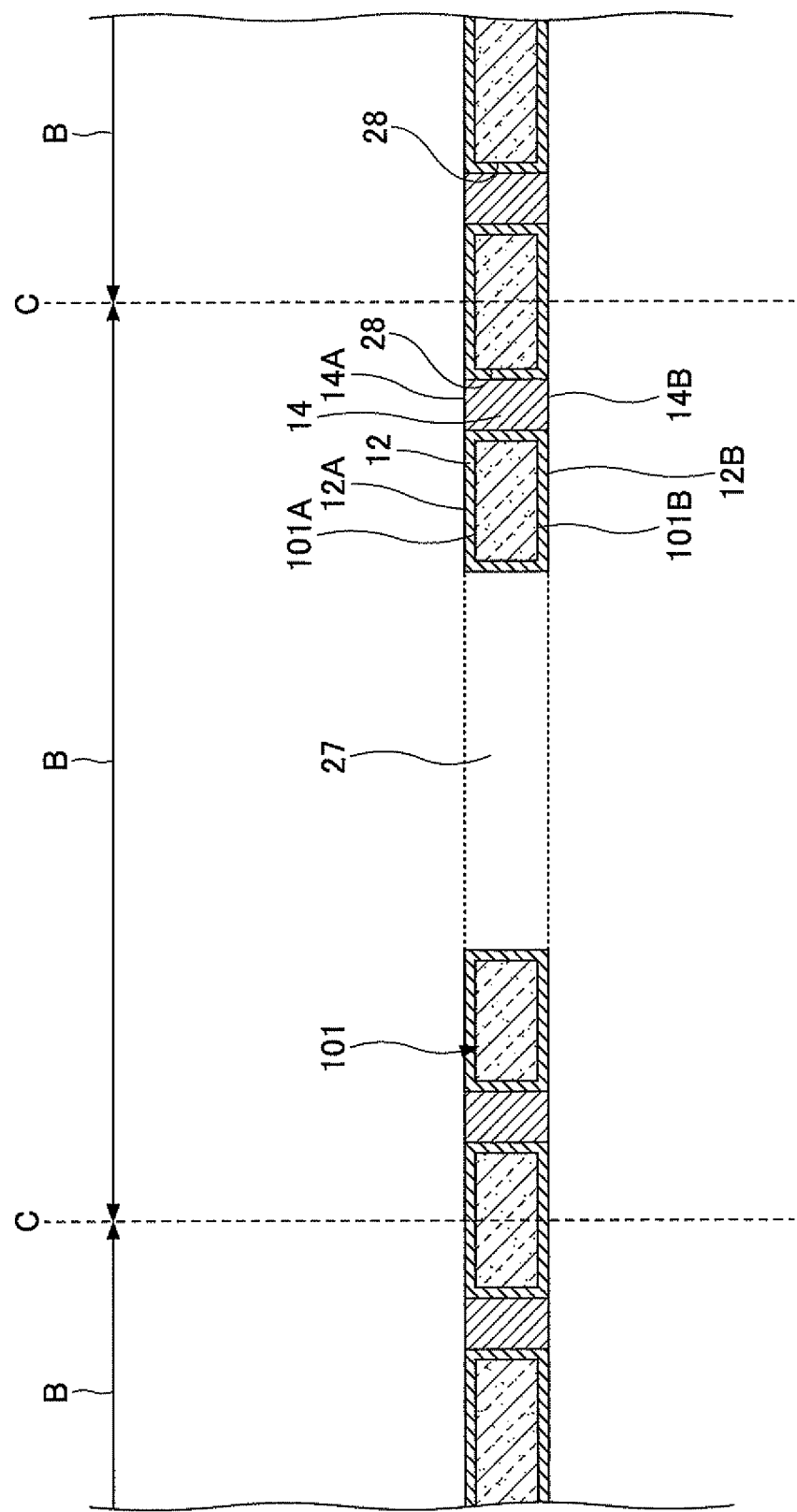
FIG. 6 is a drawing (part 4) illustrating a process step of manufacturing the semiconductor device according to the embodiment.

In the process step (i.e., through-hole-electrode forming step) illustrated in FIG. 6, the through-hole electrodes 14 are formed in the through holes 28 having the insulating film 12 formed thereon.

Specifically, the through-hole electrodes may be formed by use of a plating method, for example. Cu may be used as the material of the through-hole electrodes 14.

In this process, the through-hole electrodes 14 are formed such that the end faces 14A of the through-hole electrodes 14 are substantially flush with the upper surface 12A of the insulating film 12, and such that the end faces 14B of the through-hole electrodes 14 are substantially flush with the lower surface 12B of the insulating film 12.

Figure 7:
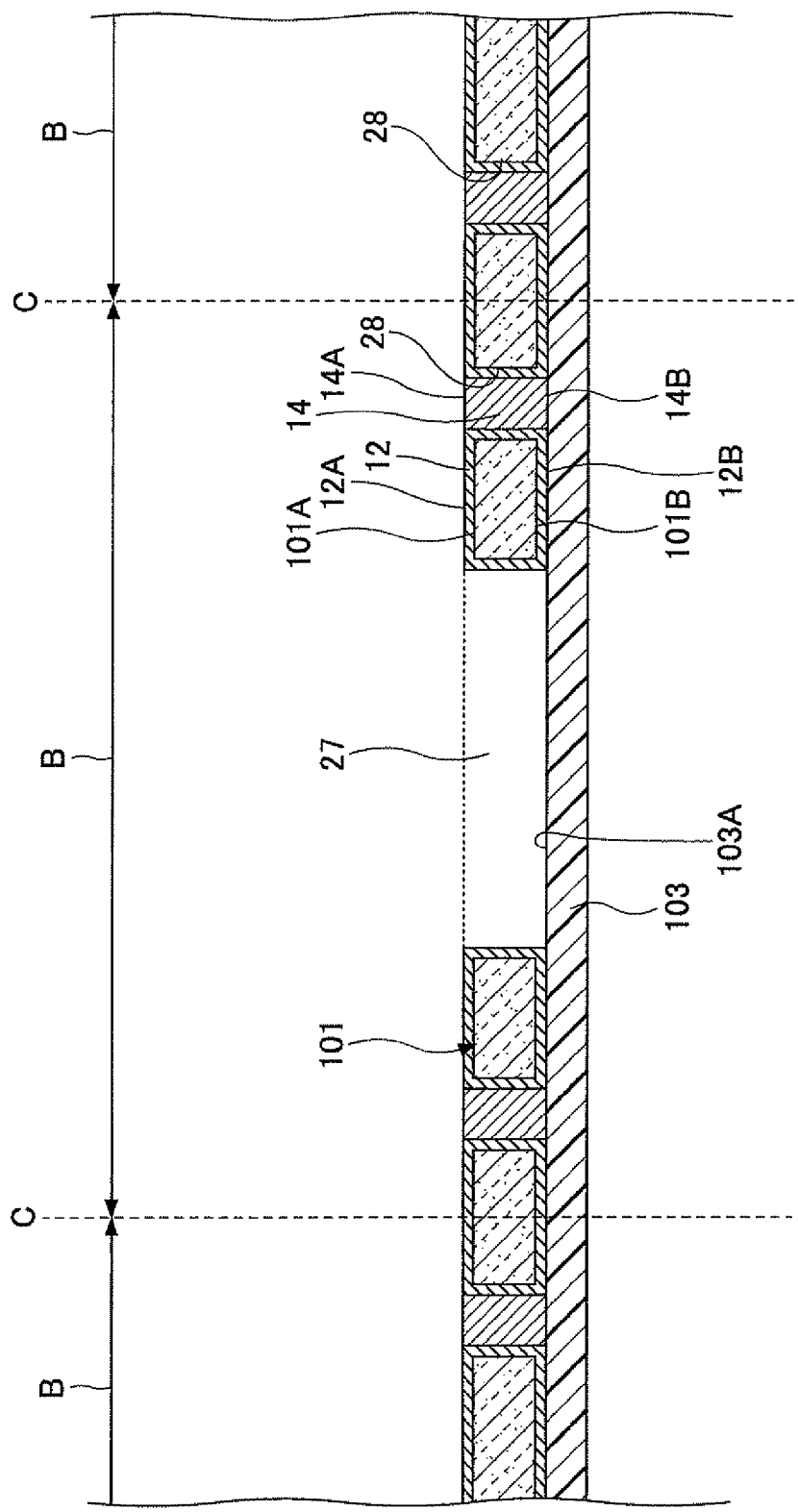
FIG. 7 is a drawing (part 5) illustrating a process step of manufacturing the semiconductor device according to the embodiment.

In the process step (i.e., first insulating-resin-layer attaching step) illustrated in FIG. 7, a first insulating resin layer 103 in a semi-cured state is attached to the lower surface 101B of the substrate member 101 to seal the lower end of the accommodating hole 27.

The first insulating resin layer 103 is one of the members that are to constitute the resin member 18 illustrated in FIG. 2. The first insulating resin layer 103 that has been semi cured is fully cured in the process step illustrated in FIG. 10, which will be described later, to become the second resin member 42 illustrated in FIG. 2. The first insulating resin layer 103 also fills part of the gaps between the semiconductor chip 15 and the sidewalls of the accommodating hole 27 having the insulating film 12 formed thereon.

A thermosetting resin sheet (e.g., thermosetting epoxy resin sheet) that is semi cured, for example, may be used as the first insulating resin layer 103. In this case, the thickness of the first insulating resin layer 103 may be 30 micrometers, for example.

Figure 8:
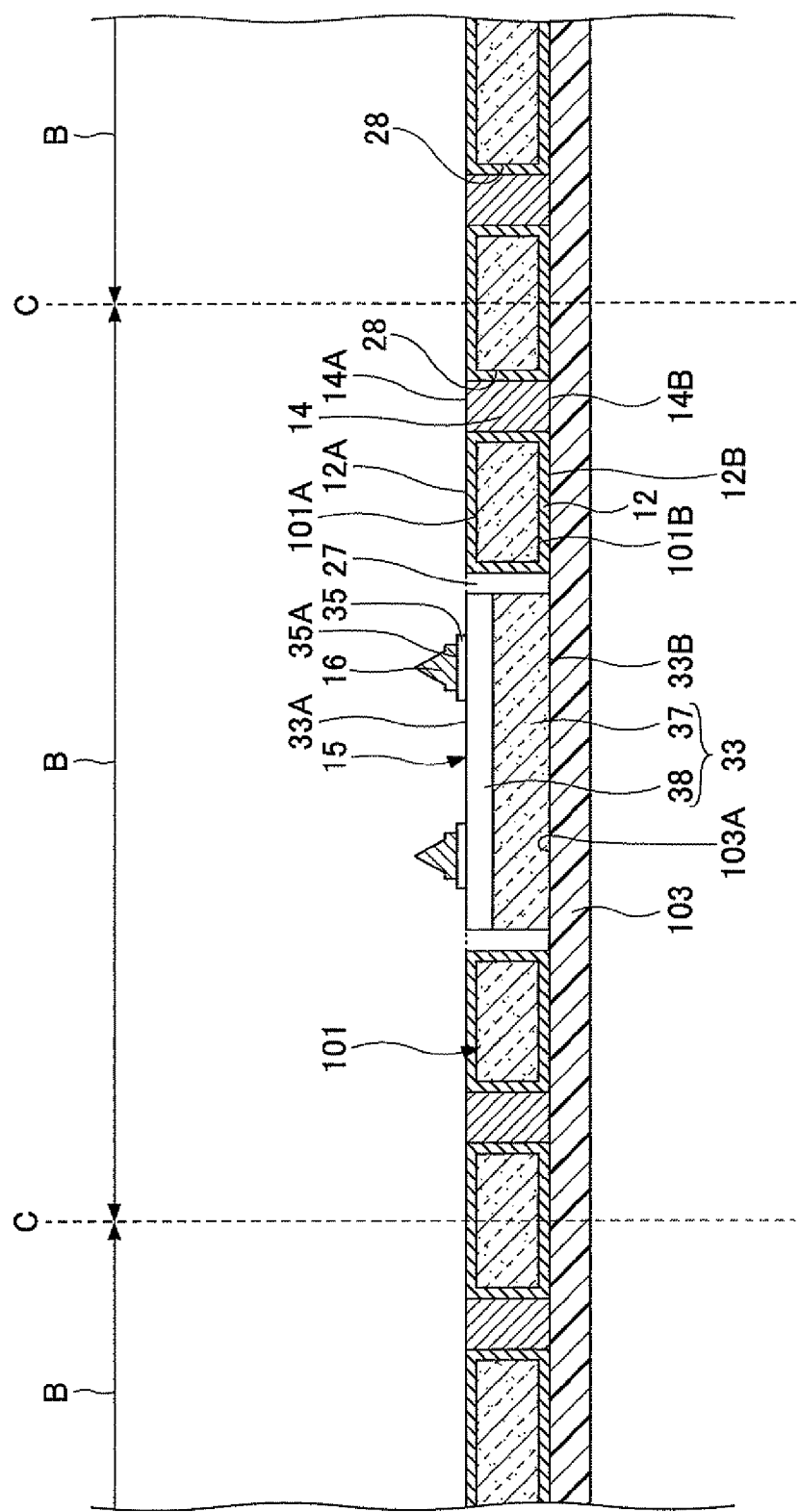
FIG. 8 is a drawing (part 6) illustrating a process step of manufacturing the semiconductor device according to the embodiment.

In the process step (i.e., semiconductor-chip accommodating step) illustrated in FIG. 8, the semiconductor chip 15 having the internal connection terminals 16 formed on the connection surfaces 35A of the electrode pads 35 are provided. At the position where the first insulating resin layer 103 is exposed through the accommodating hole 27, the back surface 33B of the chip core 33 is brought in contact with the upper surface 103A of the first insulating resin layer 103 that is in the semi-cured state. The semiconductor chip 15 having the internal connection terminals 16 formed thereon is thus placed in the accommodating hole 27.

The internal connection terminals 16 in this state have yet to have the end faces 16A formed, which was described in connection with FIG. 2. The tips of the internal connection terminals 16 at which the end faces 16A are to be formed have a pointed end. Au bumps may be used as the internal connection terminals 16. In this case, the internal connection terminals 16 may be formed by use of a wire-bonding apparatus.

The thickness of the chip core 33 may be configured to be substantially equal to the thickness of the substrate member 101.

With the above-noted arrangement, the electrode pad forming surface 33A of the chip core 33 is set substantially flush with the upper surface 101A of the substrate member 101, so that the substrate member 101 (which is to be cut into a plurality of reinforcement plates 11) having the same thermal expansion coefficient as the semiconductor substrate 37 and having substantially the same thickness as the chip core 33 is placed to surround the side faces of the semiconductor chip 15. With this arrangement, a difference in thermal expansion coefficients between the semiconductor chip 15 and the reinforcement plate 11 placed around the semiconductor chip 15 is made small. This serves to reduce the warpage of the semiconductor device 10 caused by a mismatch in thermal expansion coefficients between the semiconductor chip 15 and the reinforcement plate 11.

A semiconductor chip for use as a logic device such as a CPU or MPU may be used as the semiconductor chip 15.

Figure 9:
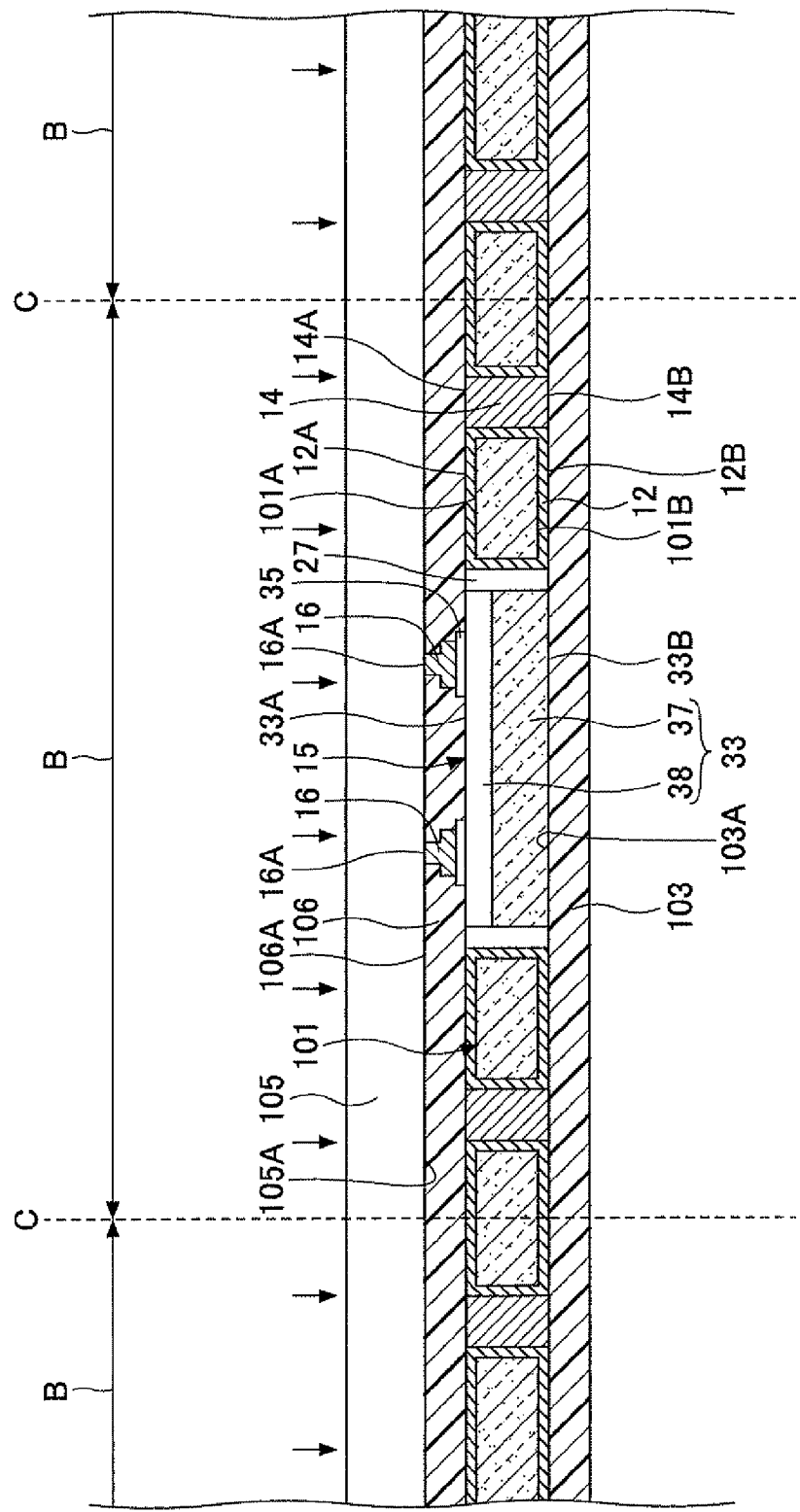
FIG. 9 is a drawing (part 7) illustrating a process step of manufacturing the semiconductor device according to the embodiment.

In the process step (i.e., second insulating-resin-layer attaching step) illustrated in FIG. 9, a second insulating resin layer 106 in a semi-cured state is placed on a flat surface 105A of a pressure plate 105. The pressure plate 105 is then pressed down until it comes in contact with the internal connection terminals 16 that have a pointed end. The second insulating resin layer 106 in the semi-cured state is attached to the upper surface 12A of the insulating film 12, the electrode pad forming surface 33A of the chip core 33, and the side faces of the internal connection terminals 16.

This second insulating-layer attaching step uses the second insulating resin layer 106 in the semi-cured state to seal the upper end of the accommodating hole 27, and also forms the flat end faces 16A at the tips of the internal connection terminals 16. The provision of the flat end faces 16A of the internal connection terminals 16 can reduce variation in height between the internal connection terminals 16. Further, the end faces 16A of the internal connection terminals 16 are exposed at the upper surface 106A of the second insulating resin layer 106.

The second insulating resin layer 106 is one of the members that are to constitute the resin member 18 illustrated in FIG. 2. The second insulating resin layer 106 that has been semi cured is fully cured in the process step illustrated in FIG. 10, which will be described later, to become the first resin member 41 illustrated in FIG. 2. The second insulating resin layer 106 also fills part of the gaps between the semiconductor chip 15 and the sidewalls of the accommodating hole 27 having the insulating film 12 formed thereon.

A thermosetting resin sheet (e.g., thermosetting epoxy resin sheet) that is semi cured, for example, may be used as the second insulating resin layer 106. In this case, the thickness of the second insulating resin layer 106 may be 40 micrometers, for example.

Figure 10:
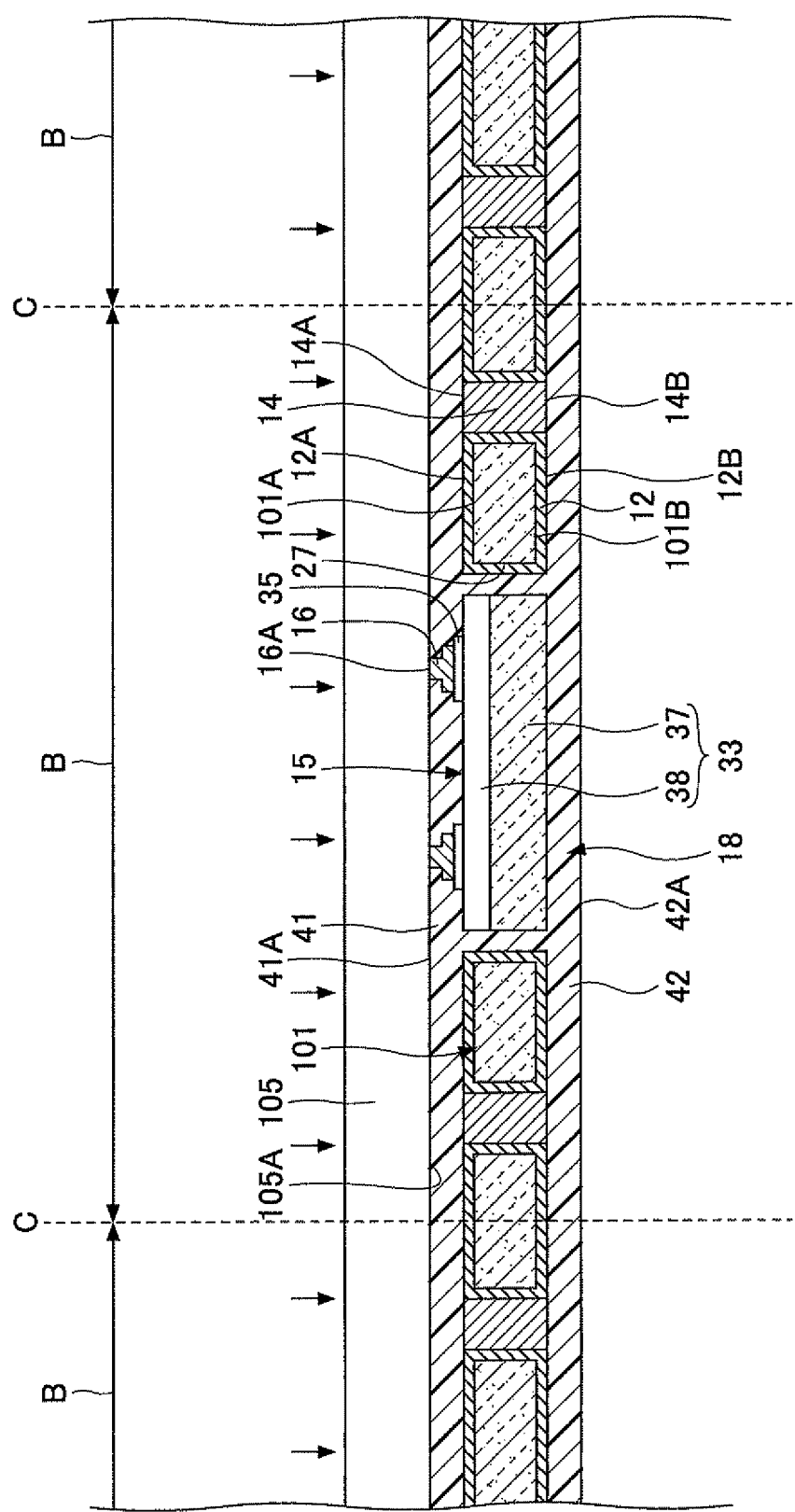
FIG. 10 is a drawing (part 8) illustrating a process step of manufacturing the semiconductor device according to the embodiment.

In the process step (i.e., resin curing step) illustrated in FIG. 10, the first and second insulating resin layers 103 and 106 are heated with the pressure plate 105 being pressed down, so that the first and second insulating resin layers 103 and 106 initially in the semi-cured state in FIG. 9 fully cure. In this manner, the resin member 18 comprised of the fully-cured first and second insulating resin layers 103 and 106 is formed.

The first and second resin members 41 and 42 constituting the resin member 18 may have the same thickness. The thickness of the first and second resin members 41 and 42 may be 30 micrometers, for example.

Figure 11:
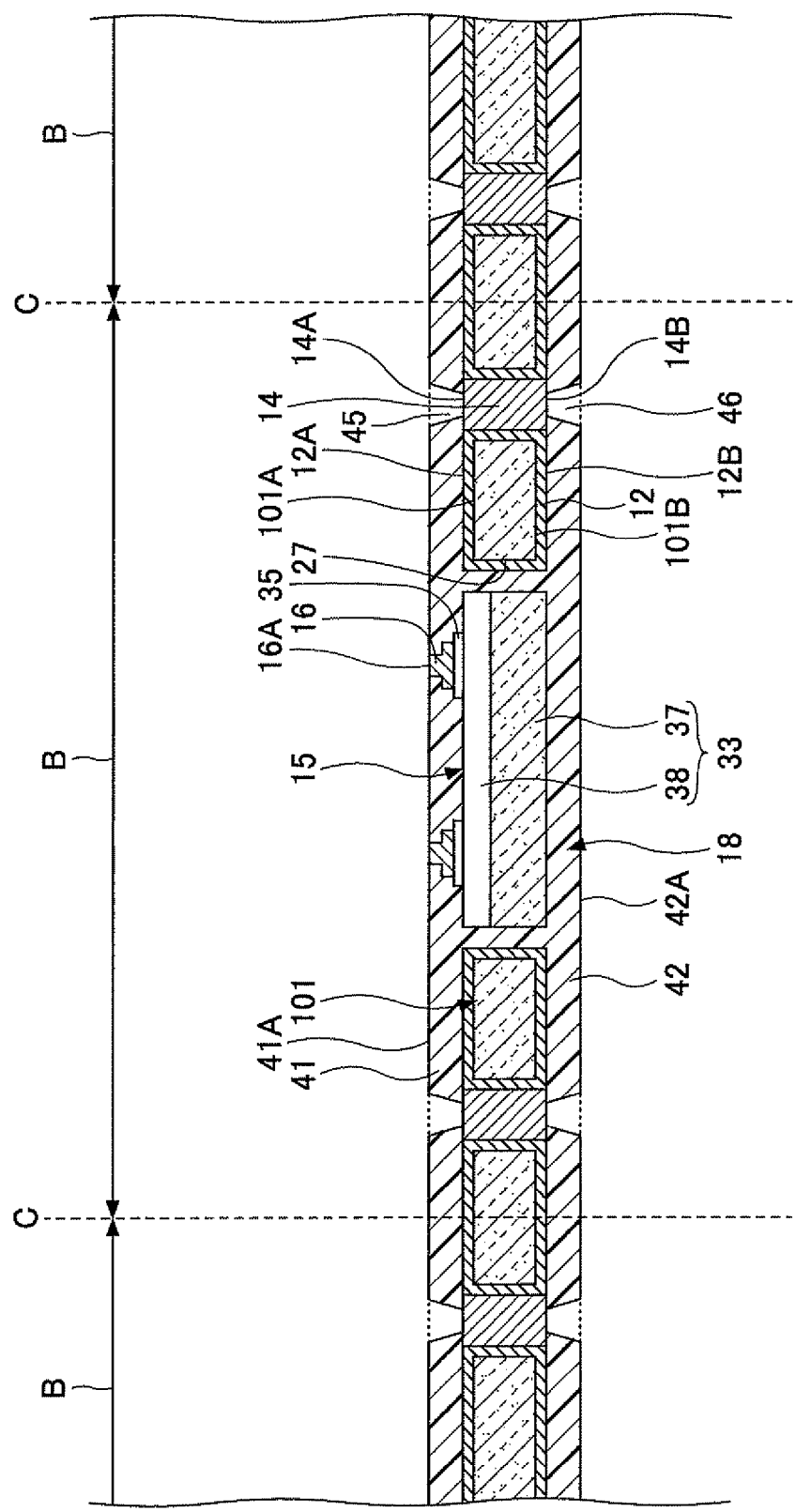
FIG. 11 is a drawing (part 9) illustrating a process step of manufacturing the semiconductor device according to the embodiment.

In the process step (i.e., first and second opening forming step) illustrated in FIG. 11, openings 45 (i.e., first openings) to expose the end faces 14A of the through-hole electrodes 14 are formed in the first resin member 41 (i.e., the portion of the resin member 18 formed on the same side of the substrate member 101 as the upper surface 101A). Further, openings 46 (i.e., second openings) to expose the end faces 14B of the through-hole electrodes 14 are formed in the second resin member 42 (i.e., the portion of the resin member 18 formed on the same side of the substrate member 101 as the lower surface 101B). Thereafter, the surfaces of the first and second resin members 41 and 42 illustrated in FIG. 11 are subjected to a desmear process.

Specifically, the openings 45 and 46 may be formed by using a laser to process the resin member 18 at the positions where the end faces 14A and 14B of the through-hole electrodes 14 are situated.

Figure 12:
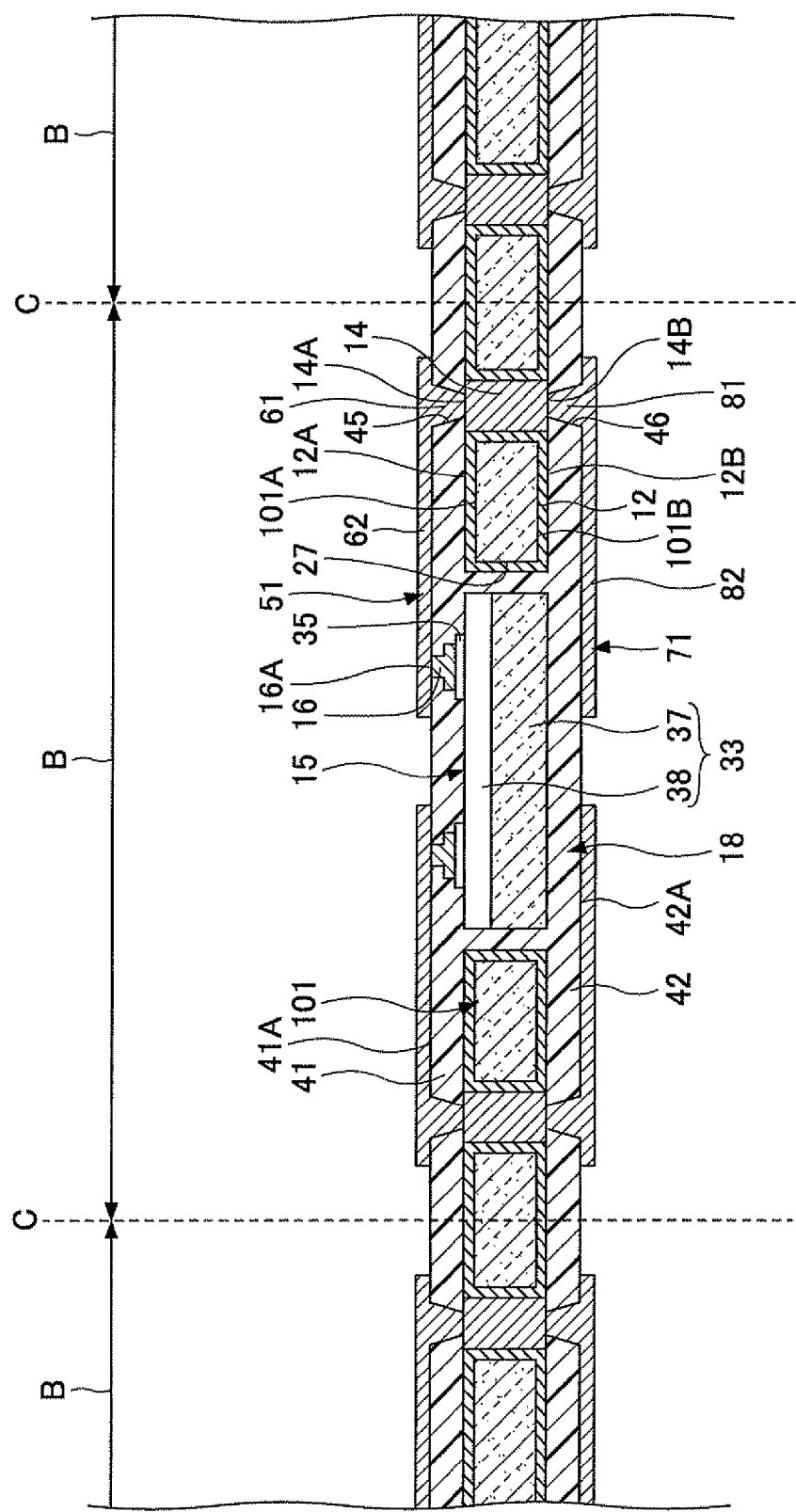
FIG. 12 is a drawing (part 10) illustrating a process step of manufacturing the semiconductor device according to the embodiment.

In the process step (i.e., interconnection pattern forming step) illustrated in FIG. 12, the interconnection patterns 51 including the vias 61 and the interconnection lines 62 are formed on the upper surface 41A of the first resin member 41, on the end faces 16A of the internal connection terminals 16, and in the openings 45. Further, the interconnection patterns 71 including the vias 81 and the interconnection lines 82 are formed on the surface 42A of the second resin member 42 and in the openings 46.

Specifically, the interconnection patterns 51 and 71 may be simultaneously formed by use of semi-additive method, for example. With this arrangement, the semiconductor chip 15 is electrically connected to the through-hole electrodes 14 through the interconnection patterns 51. Further, the interconnection patterns 71 are electrically connected to the interconnection patterns 51 through the through-hole electrodes 14. Cu may be used as the material of the interconnection patterns 51 and 71.

Figure 13:
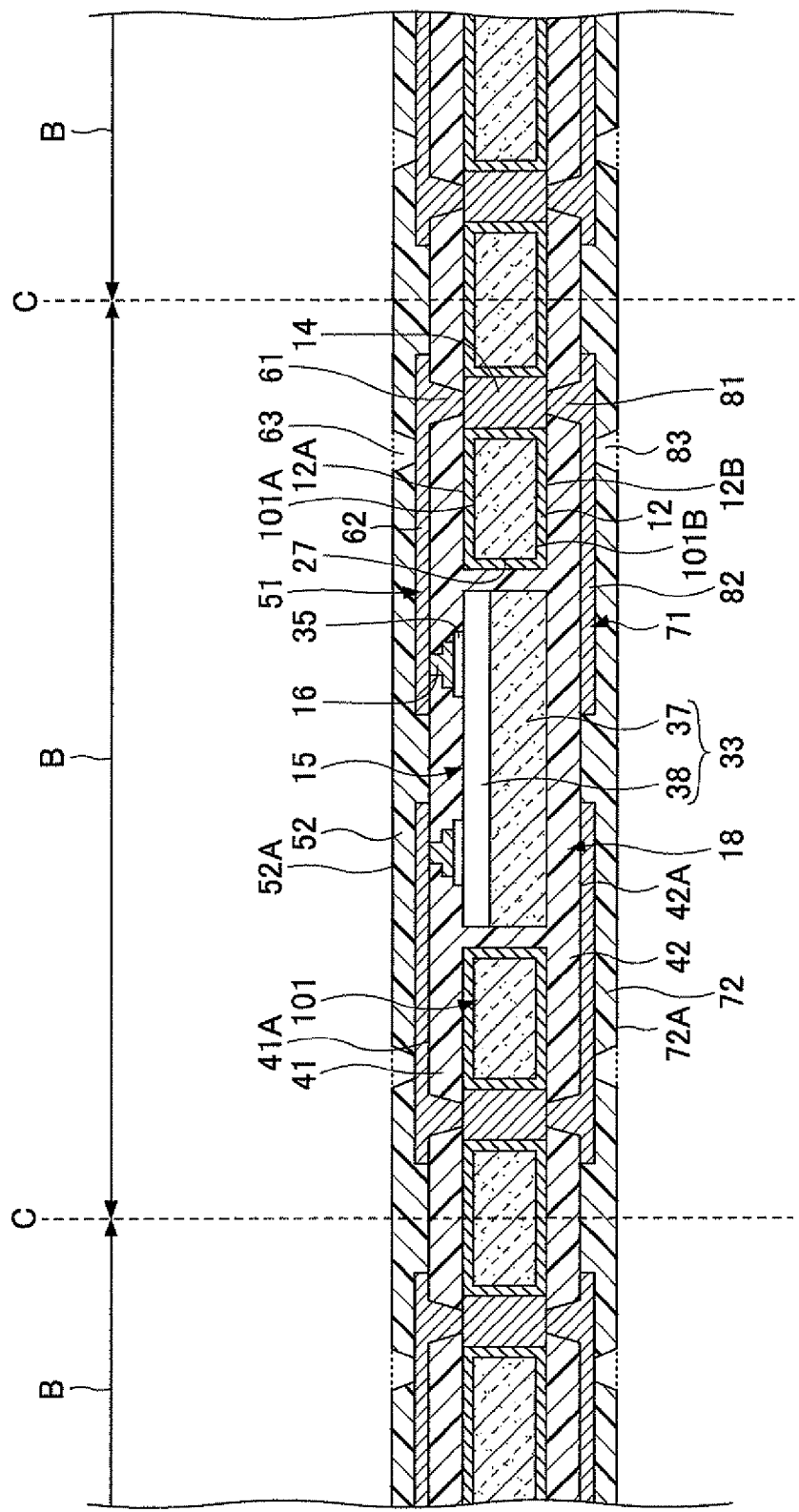
FIG. 13 is a drawing (part 11) illustrating a process step of manufacturing the semiconductor device according to the embodiment.

In the process step (i.e., insulating layer forming step) illustrated in FIG. 13, the insulating layer 52 (i.e., first insulating layer) having the openings 63 (i.e., third openings) to expose the interconnection lines 62 is formed on the upper surface 41A of the first resin member 41. Further, the insulating layer 72 (i.e., second insulating layer) having the openings 83 (i.e., fourth openings) to expose the interconnection lines 82 is formed on the upper surface 42A of the second resin member 42. The insulating layers 52 and 72 may be formed concurrently. Thereafter, the surfaces of the insulating layers 52 and 72 having the openings 63 and 83 formed therein are subjected to a desmear process.

For the provision of the insulating layers 52 and 72, thermosetting resin sheets (e.g., thermosetting epoxy resin sheets) in a semi-cured state are attached to the surface 41A of the first resin member 41 and the surface 42A of the second resin member 42, respectively. The thermosetting resin sheets in the semi-cured state are then heated to fully cure, followed by using a laser to process the thermosetting resin sheets at the positions where the openings 63 and 83 are to be formed. The thicknesses of the insulating layers 52 and 72 are set substantially equal to each other. The thickness of the insulating layers 52 and 72 may be 30 micrometers, for example.

Figure 14:
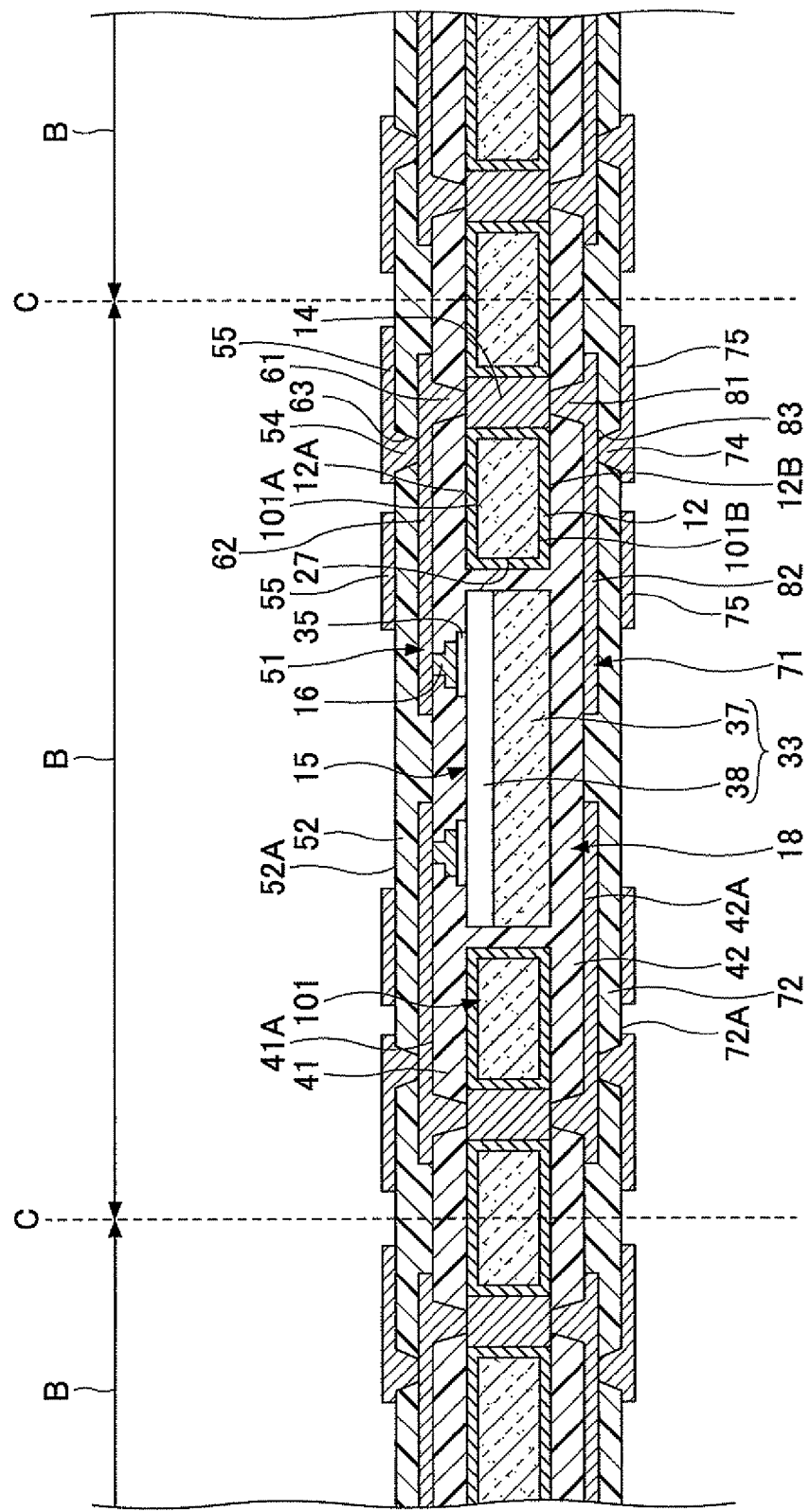
FIG. 14 is a drawing (part 12) illustrating a process step of manufacturing the semiconductor device according to the embodiment.

In the process step (i.e., via-and-external-connection-pad forming step illustrated in FIG. 14, the vias 54 and 74, the external connection pads 55 formed integrally with the vias 54, and the external connection pads 75 formed integrally with the vies 74 are formed simultaneously.

Specifically, the vias 54 and 74 and the external connection pads 55 and 75 may be formed by use of a semi-additive method, for example. The vias 54 are formed in the openings 63, and the vias 74 are formed in the openings 83. The external connection pads 55 are formed on the surface 52A of the insulating layer 52, and the external connection pads 75 are formed on the surface 72A of the insulating layer 72. The material of the vias 54 and 74 and the external connection pads 55 and 75 may be Cu, for example.

In this manner, the external connection terminals 24 are formed on the lower surface 101B of the substrate member 101, and the external connection terminals 25 are formed on the upper surface 101A of the substrate member 101. With this arrangement, another semiconductor device 94 (see FIG. 2) electrically connected to the semiconductor device 10 may be disposed on the semiconductor device 10, thereby achieving a higher mounting density.

Figure 15:
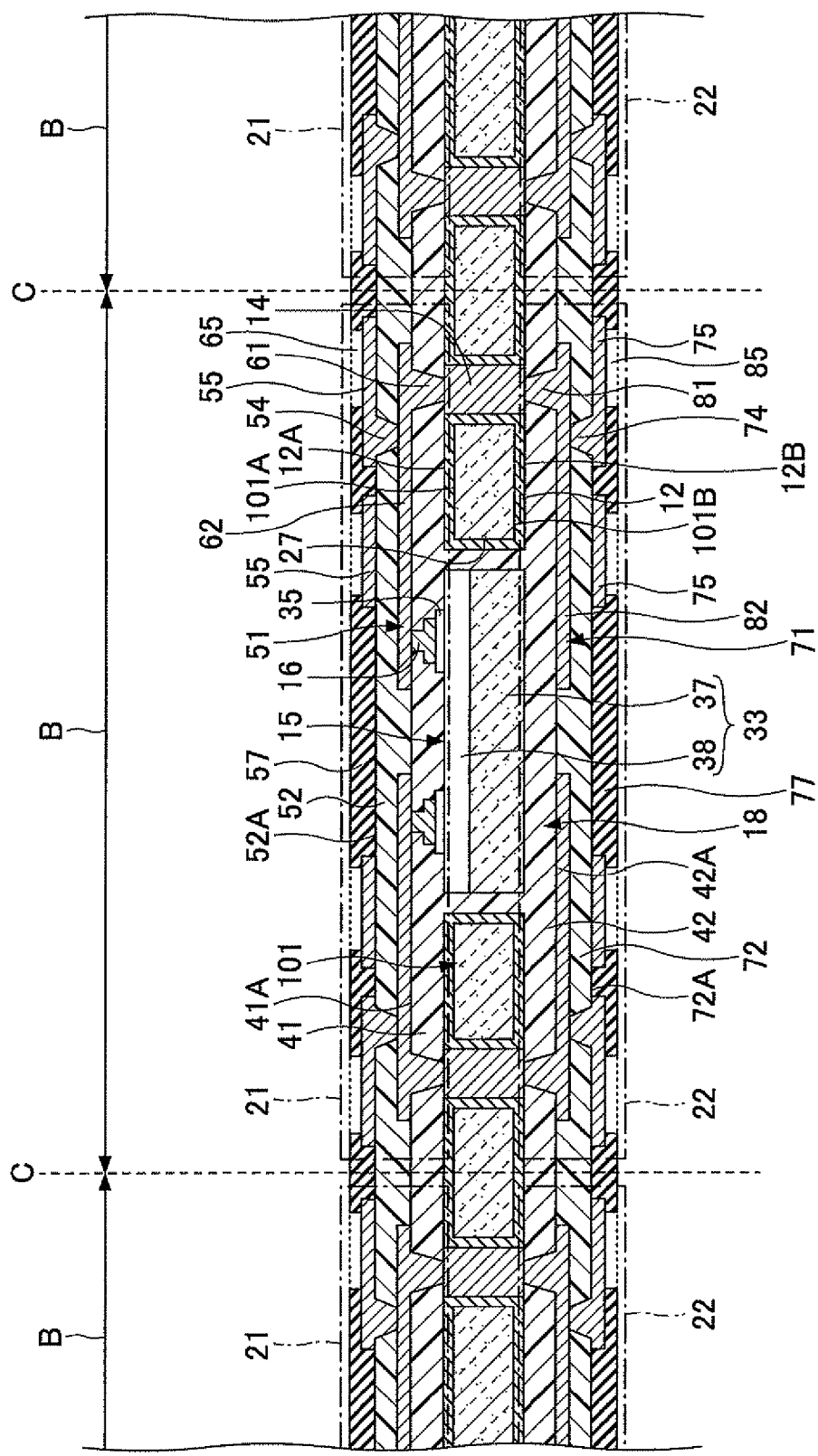
FIG. 15 is a drawing (part 13) illustrating a process step of manufacturing the semiconductor device according to the embodiment.

In the process step illustrated in FIG. 15, the solder resist layer 57 having the openings 65 to expose the external connection pads 55 is formed on the surface 52A of the insulating layer 52. Further, the solder resist layer 77 having the openings 85 to expose the external connection pads 75 is formed on the surface 72A of the insulating layer 72.

In the manner as described above, the first multilayer interconnection structure 21 is formed on the same side of the substrate member 101 as the upper surface 101A. Further, the second multilayer interconnection structure 22 having a similar configuration to the first multilayer interconnection structure 21 is formed on the same side of the substrate member 101 as the lower surface 101B.

In this manner, multilayer interconnection structures having similar configurations (i.e., the first and second multilayer interconnection structures 21 and 22 in the present embodiment) are concurrently formed on both surfaces of the resin member 18 (i.e., on the surfaces 41A and 42A of the first and second resin members 41 and 42). This makes it possible to reduce the warpage of the semiconductor device 10 at the time of manufacture.

The first multilayer interconnection structure 21 is formed on the same side of the substrate member 101 as the upper surface 101A. Also, the second multilayer interconnection structure 22 is formed on the same side of the substrate member 101 as the lower surface 101B. This makes it possible to further increase the extent of multilayer interconnection structures.

Figure 16:
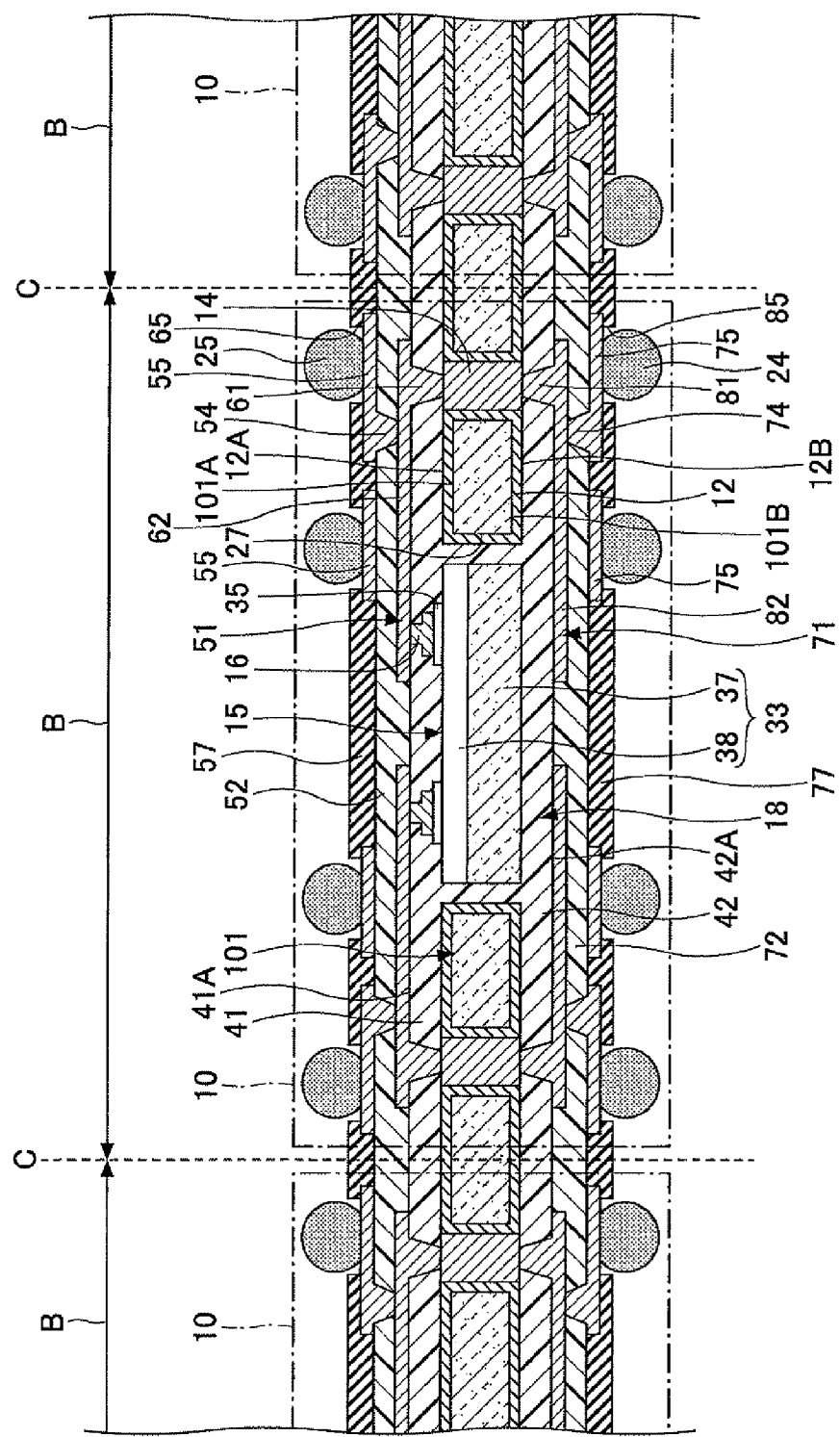
FIG. 16 is a drawing (part 14) illustrating a process step of manufacturing the semiconductor device according to the embodiment.

In the process step illustrated in FIG. 16, the external connection terminals 25 are formed on the external connection pads 55 exposed through the openings 65, and the external connection terminals 24 are formed on the external connection pads 75 exposed through the openings 85. With this, a structure corresponding to the semiconductor device 10 is formed in each of the semiconductor device forming areas B.

Figure 17:
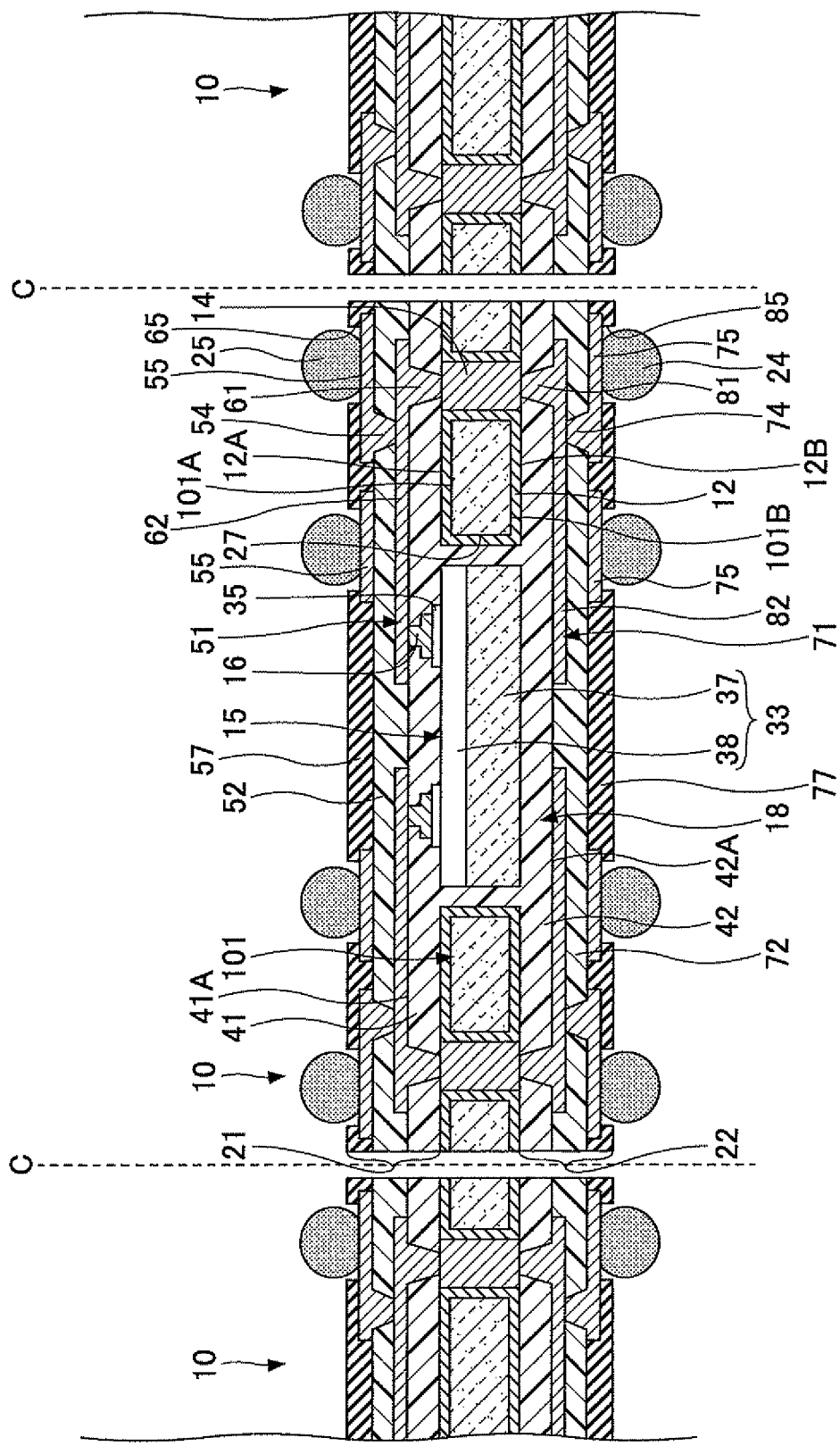
FIG. 17 is a drawing (part 15) illustrating a process step of manufacturing the semiconductor device according to the embodiment.

In the process step illustrated in FIG. 17, the structure inclusive of the substrate member 101 illustrated in FIG. 16 is cut at the cut positions C. With this, semiconductor devices 10 are made as separate pieces.

According to the method of manufacturing a semiconductor device of the present embodiment, the substrate member 101 serving as a basis for plural reinforcement plates 11 has substantially the same thickness as the chip core 33, and is made of the same material as the semiconductor substrate 37. The first insulating resin layer 103 in a semi-cured state is attached to the lower surface 101B of the substrate member 101 to seal the lower end of the accommodating hole 27. At the position where the first insulating resin layer 103 is exposed through the accommodating hole 27, the back surface 335 of the chip core 33 is brought in contact with the upper surface 103A of the first insulating resin layer 103. The semiconductor chip 15 having the internal connection terminals 16 formed thereon is thus placed in the accommodating hole 27. The second insulating resin layer 106 in the semi-cured state is attached to the upper surface 101A of the substrate member 101, the electrode pad forming surface 33A of the chip core 33, and the side faces of the internal connection terminals 16. The second insulating resin layer 106 in the semi-cured state thus seals the upper end of the accommodating hole 27. Further, the end faces 16A are formed at the tips of the internal connection terminals 16, followed by causing the first and second insulating resin layers 103 and 106 in the semi-cured state to fully cure, with the second insulating resin layer 106 being urged, to form the resin member 18. Consequently, the substrate member 101 having the same thermal expansion coefficient as the semiconductor substrate 37 is securely placed around the side faces of the semiconductor chip 15. With this arrangement, a difference in thermal expansion coefficients between the semiconductor chip 15 and the reinforcement plate 11 situated around the semiconductor chip 15 is made small. This serves to reduce the warpage of the semiconductor device 10 caused by a mismatch in thermal expansion coefficients between the semiconductor chip 15 and the reinforcement plate 11.

Moreover, multilayer interconnection structures having similar configurations (i.e., the first and second multilayer interconnection structures 21 and 22 in the present embodiment) are concurrently formed on both surfaces of the resin member 18 (i.e., on the surfaces 41A and 42A of the first and second resin members 41 and 42). This makes it possible to reduce the warpage of the semiconductor device 10 at the time of manufacture.

Further, the first multilayer interconnection structure 21 is formed on the same side of the substrate member 101 as the upper surface 101A. Also, the second multilayer interconnection structure 22 is formed on the same side of the substrate member 101 as the lower surface 101B. This makes it possible to further increase the extent of multilayer interconnection structures.

In regard to the method of manufacturing the semiconductor device 10 of the present embodiment, a description has been given of an example in which the semiconductor chip 15 having the internal connection terminals 16 with pointed ends is attached to the upper surface 103A of the first insulating resin layer 103 in FIG. 8. Notwithstanding this, the semiconductor chip 15 having internal connection terminals with the end faces 16A formed by coining may be attached to the upper surface 103A of the first insulating resin layer 103 in the process step illustrated in FIG. 8.

Further, the present invention is not limited to these embodiments, but various variations and modifications may be made without departing from the scope of the present invention.

The present application is based on Japanese priority application No. 2009-146016 filed on Jun. 19, 2009, with the Japanese Patent Office, the entire contents of which are hereby incorporated by reference.

What is claimed is:

1. A semiconductor device, comprising:
a reinforcement plate having a first surface, a second surface situated opposite the first surface, an accommodating hole, and a through hole, each of the accommodating hole and the through hole extending from the first surface to the second surface;
a semiconductor chip disposed in the accommodating hole, the semiconductor chip including a chip core and electrode pads formed on an electrode pad forming surface of the chip core, the chip core having substantially the same thickness as the reinforcement plate and including a semiconductor substrate, the semiconductor chip having the electrode pad forming surface flush with the first surface;
internal connection terminals formed on the electrode pads and having end faces on an opposite side to a side connected to the electrode pads;
a through-hole electrode disposed in the through hole;
an insulating film disposed between the through-hole electrode and a sidewall of the through hole;
a resin member sealing the semiconductor chip and the reinforcement plate, the resin member including a first portion disposed on the electrode pad forming surface of the semiconductor chip and including a second portion disposed on another surface of the semiconductor chip opposite the electrode pad forming surface, the first portion and the second portion being connected to each other via the accommodating hole to form a unitary continuous resin chunk in which the semiconductor chip disposed in the accommodating hole is buried, said another surface of the semiconductor chip opposite the electrode pad forming surface being entirely covered with the second portion of the resin member;
a first interconnection pattern disposed on the same side of the reinforcement plate as the first surface to connect between the through-hole electrode and at least one of the end faces of the electrode pads, at least part of the first interconnection pattern being situated in the resin member; and
a second interconnection pattern disposed on the same side of the reinforcement plate as the second surface to be connected to the through-hole electrode, at least part of the second interconnection pattern being situated in the resin member,
wherein a material of the reinforcement plate is the same as a material of the semiconductor substrate,
wherein the end faces of the internal connection pads formed on the electrode pads are flush with and exposed at an upper surface of the first portion of the resin member,
wherein the first interconnection pattern includes a first via penetrating through the first portion of the resin member, the first via being in direct contact with a first end face of the through hole electrode,
wherein the second interconnection pattern includes a second via penetrating through the second portion of the resin member, the second via being in direct contact with a second end face of the through hole electrode, and
wherein the first interconnection pattern is in direct contact with the upper surface of the first portion of the resin member, is in direct contact with the through-hole electrode, and is in direct contact with at least one of the end faces of the internal connection terminals.

2. The semiconductor device as claimed in claim 1, further comprising:
a first insulating layer stacked on the resin member on the same side of the reinforcement plate as the first surface to cover the first interconnection pattern;
a first external connection pad disposed on a surface of the first insulating layer;

a first via penetrating through the first insulating layer to connect between the first interconnection pattern and the first external connection pad;

a second insulating layer stacked on the resin member on the same side of the reinforcement plate as the second surface to cover the second interconnection pattern;

a second external connection pad disposed on a surface of the second insulating layer; and a second via penetrating through the second insulating layer to connect between the second interconnection pattern and the second external connection pad.

3. The semiconductor device as claimed in claim 1, wherein the material of the semiconductor substrate and the material of the reinforcement plate are silicon.

* * * * *